(12) United States Patent
Tsao et al.

(10) Patent No.: US 7,965,560 B2
(45) Date of Patent: Jun. 21, 2011

(54) NON-VOLATILE MEMORY WITH POWER-SAVING MULTI-PASS SENSING

(75) Inventors: Shou-Chang Tsao, San Jose, CA (US); Yan Li, Milpitas, CA (US)

(73) Assignee: Sandisk Corporation, Milpitas, CA (US)

(*) Notice: Subject to any disclaimer, the term of this patent is extended or adjusted under 35 U.S.C. 154(b) by 0 days.

(21) Appl. No.: 12/763,365

(22) Filed: Apr. 20, 2010

(65) Prior Publication Data
US 2010/0202212 A1    Aug. 12, 2010

Related U.S. Application Data

(62) Division of application No. 11/323,569, filed on Dec. 29, 2005, now Pat. No. 7,733,704.

(51) Int. Cl.
*G11C 11/34* (2006.01)

(52) U.S. Cl. ......... 365/185.21; 365/185.25; 365/185.22; 365/185.03

(58) Field of Classification Search ............. 365/185.21, 365/185.25, 185.22, 185.03
See application file for complete search history.

(56) References Cited

U.S. PATENT DOCUMENTS

| | | | |
|---|---|---|---|
| 4,357,685 A | 11/1982 | Daniele et al. | |
| 4,852,064 A | 7/1989 | Kim et al. | |
| 5,070,032 A | 12/1991 | Yuan et al. | |
| 5,095,344 A | 3/1992 | Harari | |
| 5,172,338 A | 12/1992 | Mehrotra et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,388,078 A | 2/1995 | Arakawa | |
| 5,418,752 A | 5/1995 | Harari et al. | |
| 5,570,315 A | 10/1996 | Tanaka et al. | |
| 5,595,924 A | 1/1997 | Yuan et al. | |
| 5,652,719 A | 7/1997 | Tanaka et al. | |
| 5,661,053 A | 8/1997 | Yuan | |

(Continued)

FOREIGN PATENT DOCUMENTS

JP    56-143592 A    11/1981

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Vu A Le
*Assistant Examiner* — Han Yang
(74) *Attorney, Agent, or Firm* — David Wright Tremaine LLP

(57) ABSTRACT

A non-volatile memory device capable of reading and writing a large number of memory cells with multiple read/write circuits in parallel has features to reduce power consumption during sensing, which is included in read, and program/verify operations. A sensing verify operation includes one or more sensing cycles relative to one or more demarcation threshold voltages to determine a memory state. In one aspect, coupling of the memory cells to their bit lines are delayed during a precharge operation in order to reduced the cells' currents working against the precharge. In another aspect, a power-consuming precharge period is minimized by preemptively starting the sensing in a multi-pass sensing operation. High current cells not detected as a result of the premature sensing will be detected in a subsequent pass.

9 Claims, 24 Drawing Sheets

GENERAL POWER-SAVING BY REDUCING THE SETUP
PERIOD FOR THE FIRST PASS OF A MULTI-PASS SENSING

U.S. PATENT DOCUMENTS

| | | |
|---|---|---|
| 5,768,192 A | 6/1998 | Eitan |
| 5,774,397 A | 6/1998 | Endoh et al. |
| 5,903,495 A | 5/1999 | Takeuchi et al. |
| 6,011,725 A | 1/2000 | Eitan |
| 6,046,935 A | 4/2000 | Takeuchi et al. |
| 6,144,600 A | 11/2000 | Ogura |
| 6,222,762 B1 | 4/2001 | Guterman et al. |
| 6,297,670 B1 | 10/2001 | Chao et al. |
| 6,657,891 B1 | 12/2003 | Shibata et al. |
| 6,977,842 B2 | 12/2005 | Nazarian |
| 7,016,230 B2 | 3/2006 | Hosono |
| 7,170,784 B2 | 1/2007 | Cernea et al. |
| 7,173,854 B2 | 2/2007 | Cernea et al. |
| 7,177,212 B2 | 2/2007 | Dudeck et al. |
| 7,280,401 B2 | 10/2007 | Di Gregorio |
| 7,466,592 B2 * | 12/2008 | Mitani et al. ............... 365/185.2 |
| 2002/0186592 A1 * | 12/2002 | Pagliato et al. .......... 365/185.21 |
| 2004/0057318 A1 | 3/2004 | Cernea et al. |
| 2004/0109357 A1 | 6/2004 | Cernea et al. |
| 2005/0057966 A1 | 3/2005 | Nazarian |
| 2005/0078524 A1 | 4/2005 | Hosono |
| 2005/0162951 A1 | 7/2005 | Dudeck et al. |
| 2005/0169082 A1 | 8/2005 | Cernea et al. |
| 2005/0237814 A1 | 10/2005 | Li et al. |
| 2006/0209592 A1 | 9/2006 | Li et al. |
| 2007/0279990 A1 | 12/2007 | Choy |
| 2008/0205163 A1 | 8/2008 | Park et al. |

FOREIGN PATENT DOCUMENTS

| | | |
|---|---|---|
| WO | WO 2004/029984 A2 | 4/2004 |

OTHER PUBLICATIONS

EPO/ISA, "Invitation to Pay Additional Fees," mailed in related International Application No. PCT/US2006/062605 on Jul. 26, 2007, 9 pages.

EPO/ISA, "Notification of Transmittal of the International Search Report and the Written Opinion of the International Searching Authority, or the Declaration," mailed in related International Application No. PCT/US2006/062605 on Sep. 20, 2007, 19 pages.

Taiwan Intellectual Property Office (IPO), "Search Report," corresponding Taiwanese Patent Application No. 095149909, mailed on Jan. 15, 2009, 3 pages (including translation.).

USPTO, "Office Action," mailed in related U.S. Appl. No. 11/322,427 on Jun. 27, 2007, 10 pages.

USPTO, "Office Action," mailed in related U.S. Appl. No. 11/322,427 on Feb. 13, 2008, 19 pages.

* cited by examiner

Multistate Memory (Conventional Gray Code)

Lower Page Programming (Conventional Gray Code)

Upper Page Programming (Conventional Gray Code)

Lower Page Read (Conventional Gray Code)

Upper Page Read (Conventional Gray Code)

Multistate Memory (LM Gray Code)

Lower Page Programming (LM Gray Code)

Upper Page Programming (LM Gray Code)

Lower Page Read (LM Gray Code)

Upper Page Read (LM Gray Code)

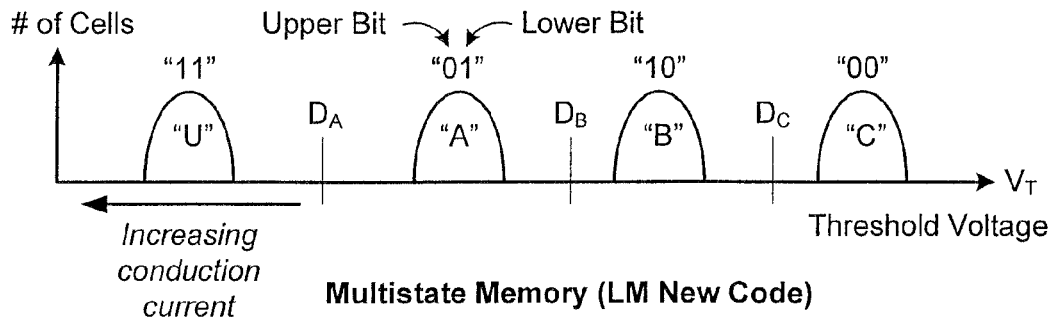
FIG. 9A Multistate Memory (LM New Code)
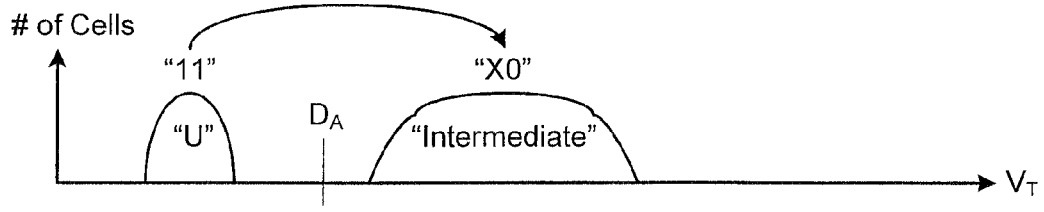
FIG. 9B Lower Page Programming (LM New Code)
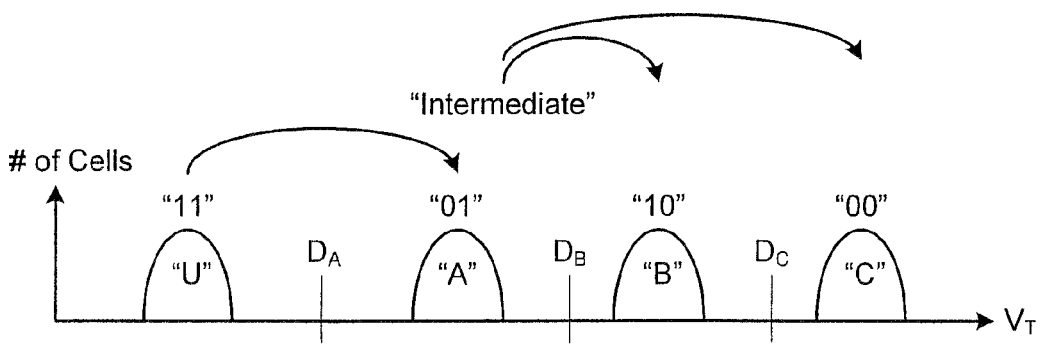
FIG. 9C Upper Page Programming (LM New Code)

Lower Page Read (LM New Code)

Upper Page Read (LM New Code)

$i_{CELL} = i_{BL0} + [i_{BLC00} + i_{BLC01} + i_{BLC02}$ $+ i_{BLC03} + i_{BLC04}]$

GENERAL POWER-SAVING BY REDUCING THE SETUP
PERIOD FOR THE FIRST PASS OF A MULTI-PASS SENSING

NON-VOLATILE MEMORY WITH POWER-SAVING MULTI-PASS SENSING

CROSS REFERENCE TO RELATED APPLICATION

This application is a divisional application of U.S. patent application Ser. No. 11/323,569, filed on Dec. 29, 2005, U.S. Patent Publication No. 2007/0171746 A1. This application also related to U.S. patent application Ser. No. 11/322,427, filed on Dec. 29, 2005, now U.S. Pat. No. 7,447,094, which application and patent are incorporated herein in their entirety by this reference.

FIELD OF THE INVENTION

This invention relates generally to non-volatile semiconductor memory such as electrically erasable programmable read-only memory (EEPROM) and flash EEPROM, and specifically ones implementing optimizations for multi-pass sensing during read and program verify operations.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1—left and T1—right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1—left is being accessed, both the T2 and T1—right are turned on to allow the current in the T1—left's portion of the channel to pass between the source and the drain. Similarly, when the storage unit T1—right is being accessed, T2 and T1—left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effectively created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND chains, a bit line is coupled to the drain terminal 56 of each NAND chain. Along each row of NAND chains, a source line may connect all their source terminals 54. Also the control gates of the NAND chains along a row are connected to a series of corresponding word lines. An entire row of NAND chains can be addressed by turning on the pair of select transistors (see FIG. 1D) with appropriate voltages on their control gates via the connected word lines. When a memory transistor representing a memory cell within the NAND chain is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist of one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

As mentioned before, conventional memory devices improve read/write operations by operating in a massively parallel manner on all even or all odd bit lines at a time. This "alternate-bit-line" architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

United States Patent Publication No. 2004-0057318-A1 discloses a memory device and a method thereof that allow sensing a plurality of contiguous memory cells in parallel. For example, all memory cells along a row sharing the same word lines are read or programmed together as a page. This "all-bit-line" architecture doubles the performance of the "alternate-bit-line" architecture while minimizing errors caused by neighboring disturb effects. However, sensing all bit lines does bring up the problem of cross-talk between neighboring bit lines due induced currents from their mutual capacitance. This is addressed by keeping the voltage difference between each adjacent pair of bit lines substantially independent of time while their conduction currents are being sensed. When this condition is imposed, all displacement currents due to the various bit lines' capacitance drop out since they all depend on a time varying voltage difference. The sensing circuit coupled to each bit line has a voltage clamp on the bit line so that the potential difference on any adjacent pair of connected bit lines is time-independent. With the bit line voltage clamped, the conventional method of sensing the discharge due to the bit line capacitance can not be applied. Instead, the sensing circuit and method allow determination of a memory cell's conduction current by noting the rate it discharges or charges a given capacitor independent of the bit line. This will allow a sensing circuit independent of the architecture of the memory array (i.e., independent of the bit line capacitance.) Especially, it allows the bit line voltages to be clamped during sensing in order to avoid bit line crosstalk.

Power consumption is one important consideration of memory devices, and especially for the ones with the all-bit-line architecture. With massively parallel sensing, the number of memory cells with conduction current flow will compound. The power consumption is even more acute for the all-bit-line architecture where there is potentially twice the number of memory cells operating in parallel than that of the alternate bit-line architecture. Furthermore, in the scheme with constant voltage bit line, the bit line is precharged while connected to the cell to maintain stable voltage conditions. This means in the precharge operation during sensing, power is expended not only to charge up the bit line but also to work against the draining cell current.

Therefore there is a general need for high performance and high capacity non-volatile memory with reduced power consumption. In particular, there is a need for a compact non-volatile memory with enhanced read and program performance that is power efficient.

SUMMARY OF INVENTION

According to one aspect of the invention, power-saving in a sensing cycle for a page of memory cells is effected by minimizing the draining effect of the memory cells during a precharge operation. This is accomplished by first charging the bit lines without coupling to the memory cells. After the bit lines have been charged to a predetermined degree will the memory cells be coupled thereto to reach a final steady state condition before sensing is to take place.

According to another aspect of the present invention, power-saving in a sensing cycle for a page of memory cells is effected by reducing the precharge period before the actual sensing. Before sensing is to take place, the voltages on the word line and the bit lines need be set up by a precharge operation. The precharge operation consumes power and yet must be of sufficient duration so that the voltages will become sufficient stable before accurate sensing can take place. The invention calls for reducing the precharge period even beyond the point where the voltages are no longer sufficiently stable for accurate sensing relative to an original reference level. This is applicable in a sensing cycle which completion takes more than one sensing sub-cycle. When the precharge in the first sub-cycle consumes more power than a subsequent sub-cycle, and the precharge period of the first is reduced to save power at the expense of the subsequent sub-cycle, overall power is saved among the two sub-cycles.

In a preferred embodiment, a first sensing sub-cycle is employed to identify the highest current states so that they could be removed from the page being sensed in order to minimize any ground loop or source bias errors. With the high current cells of the page turned off, a second sensing sub-cycle will be able to sense the remaining cells of the page with better accuracy. Since the precharge for setting up the first sensing sub-cycle consumes relative more power due to the presence of more of the higher current cells, this precharge period is reduced to save power. The prematurely shortened precharge period, before the bit lines voltage has stabilized will result in less accurate sensing. In order not to erroneously detect the lower current cells as high current cells due to the presence of transient displacement currents before the bit line stabilized, the discrimination current level is set higher to provide a safe margin. This will result in detecting less of the higher current cells as compared to sensing after the bit line voltage has stabilized. Those higher current (intermediate conducting) cells that should have been detected but fail to be detected would be caught in a subsequent second sensing sub-cycle. However, their cell current was not turned off and would make the precharge drain more power in the second sub-cycle. It will also introduce a bit more ground loop bias voltage error during the second sensing.

Additional features and advantages of the present invention will be understood from the following description of its preferred embodiments, which description should be taken in conjunction with the accompanying drawings.

BRIEF DESCRIPTION OF THE DRAWINGS

FIG. 9A illustrates threshold voltage distributions of the 4-state memory array when each memory cell stores two bits of data using the LM New code.

FIG. 9B illustrates the lower page programming in an existing, 2-round programming scheme using the LM New code.

FIG. 9C illustrates the upper page programming in an existing, 2-round programming scheme using the LM New code.

DETAILED DESCRIPTION OF THE PREFERRED EMBODIMENTS

Figure 1A:
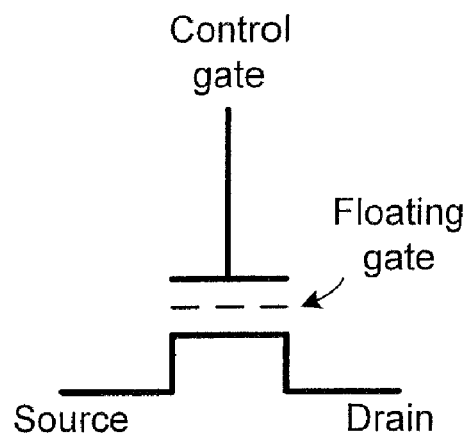
FIGS. 1A-1E illustrate schematically different examples of non-volatile memory cells.
Figure 1B:
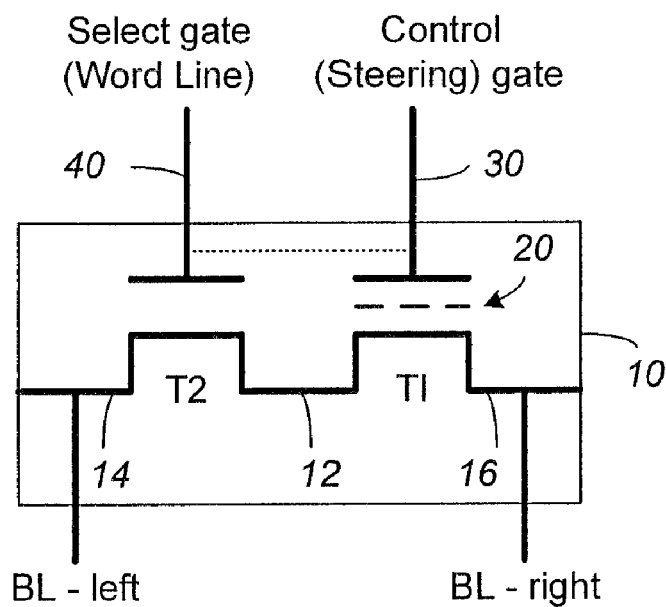
Figure 1C:
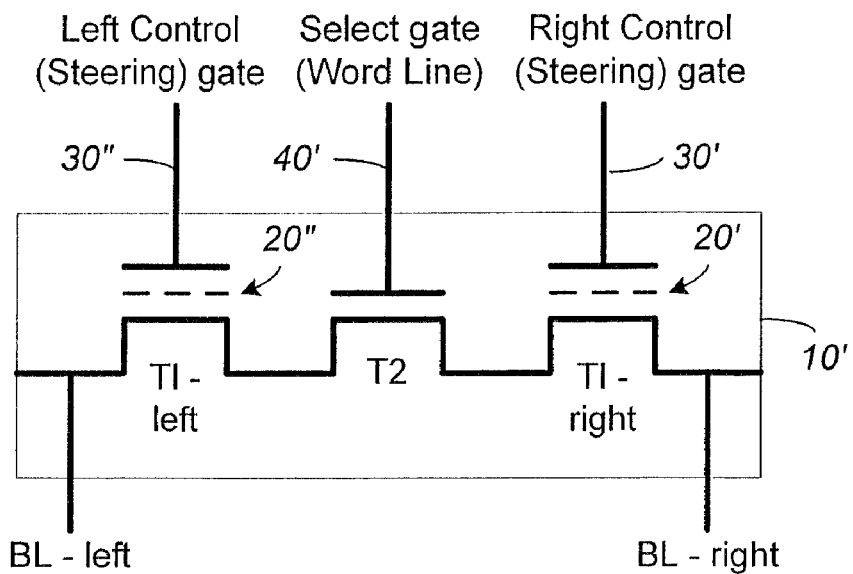
Figure 1E:
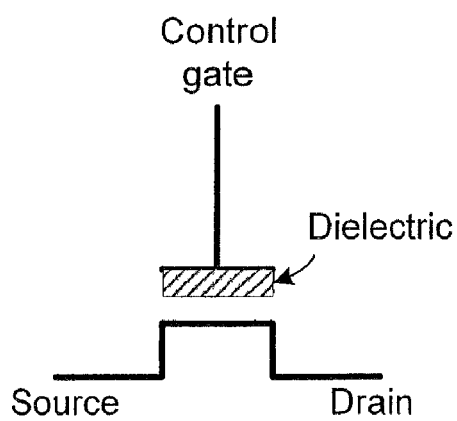
Figure 1D:
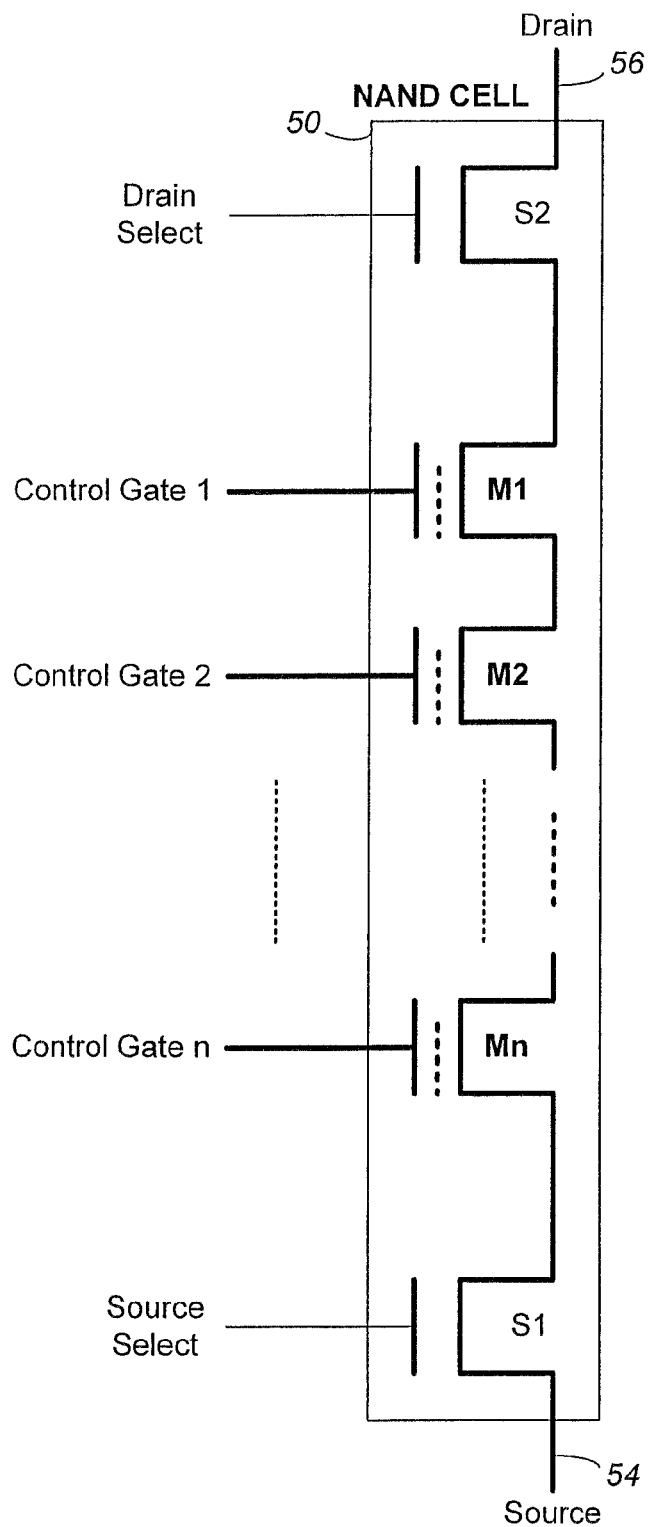
Figure 2:
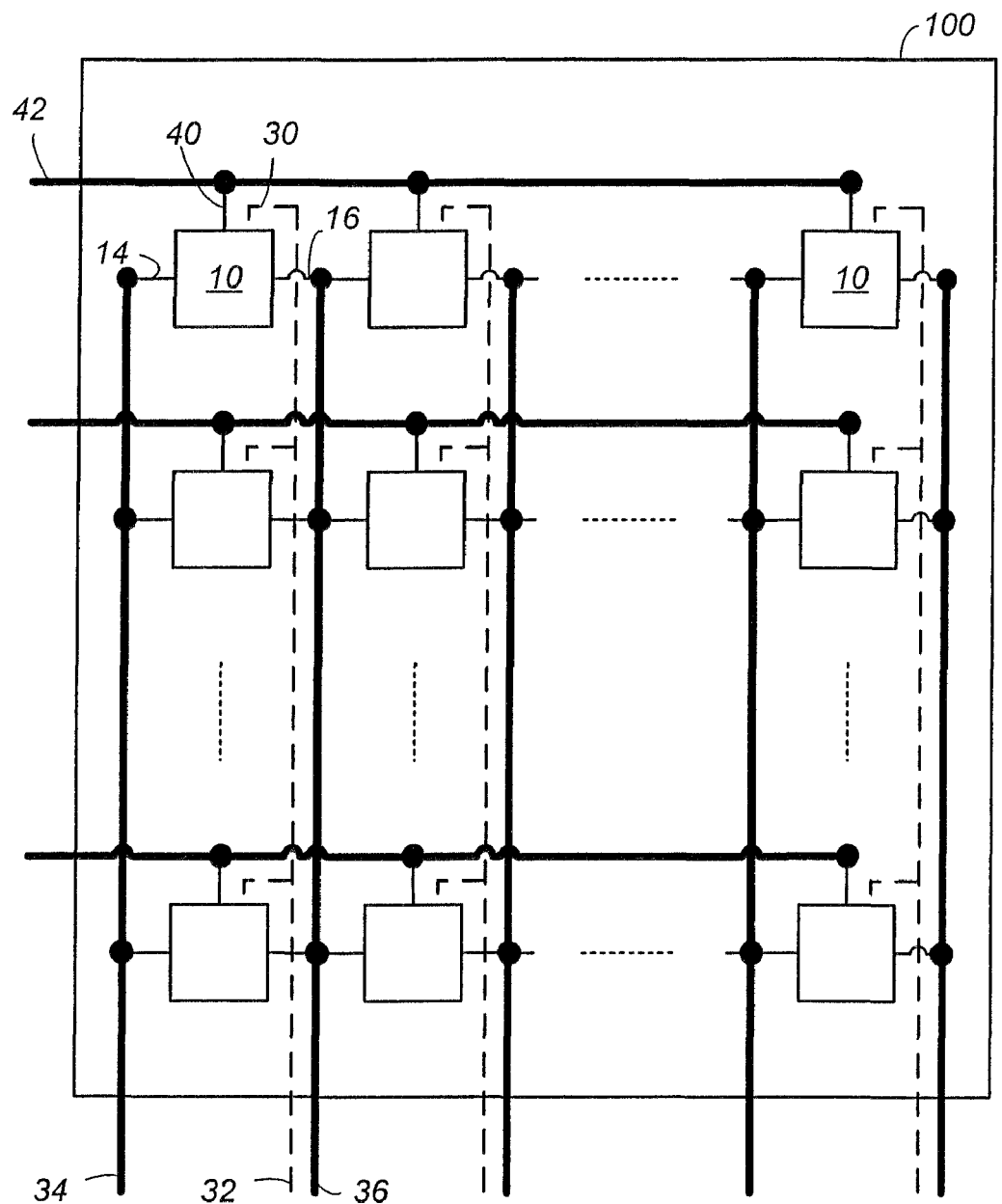
FIG. 2 illustrates an example of an NOR array of memory cells.
Figure 3:
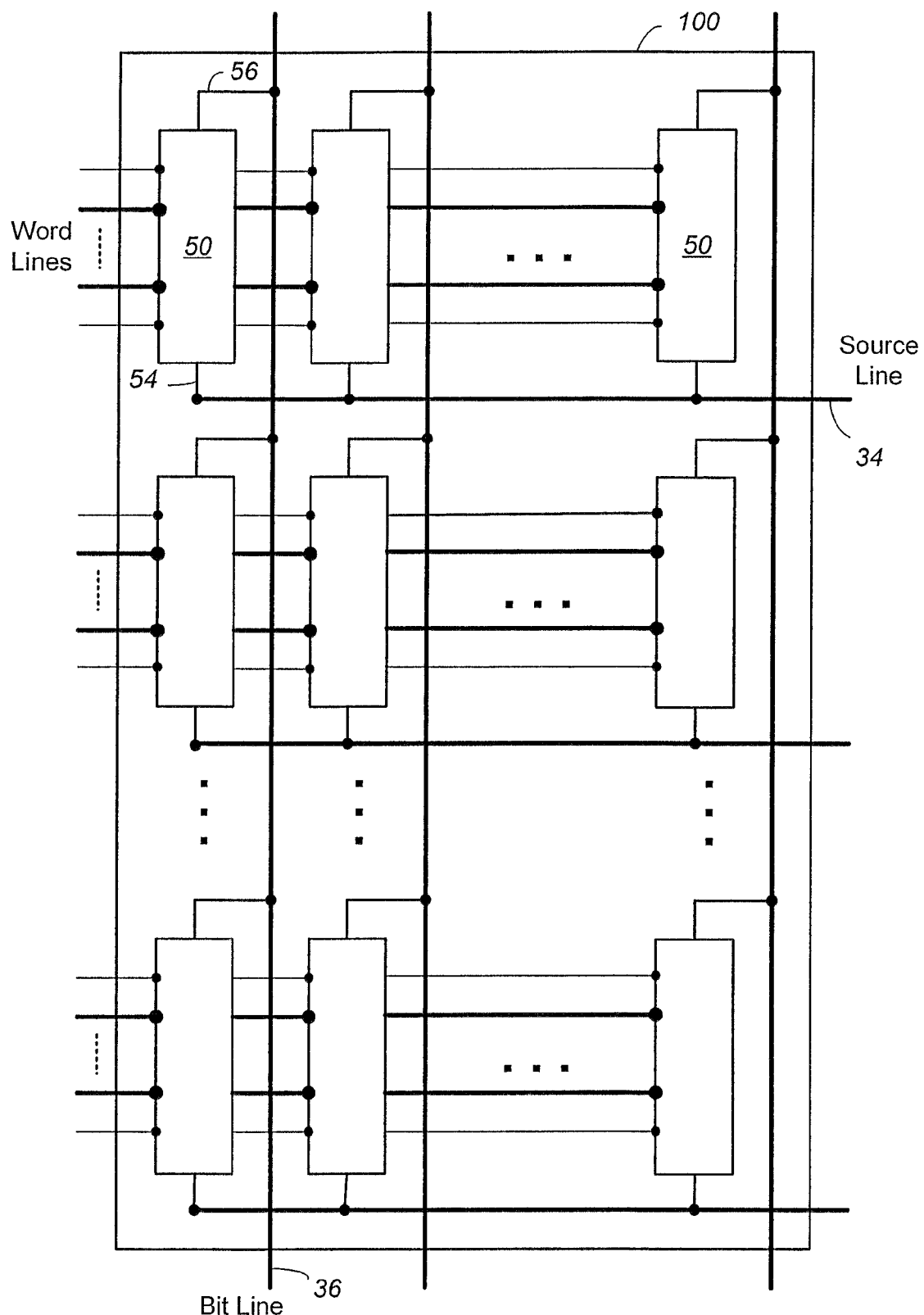
FIG. 3 illustrates an example of an NAND array of memory cells, such as that shown in FIG. 1D.
Figure 4:
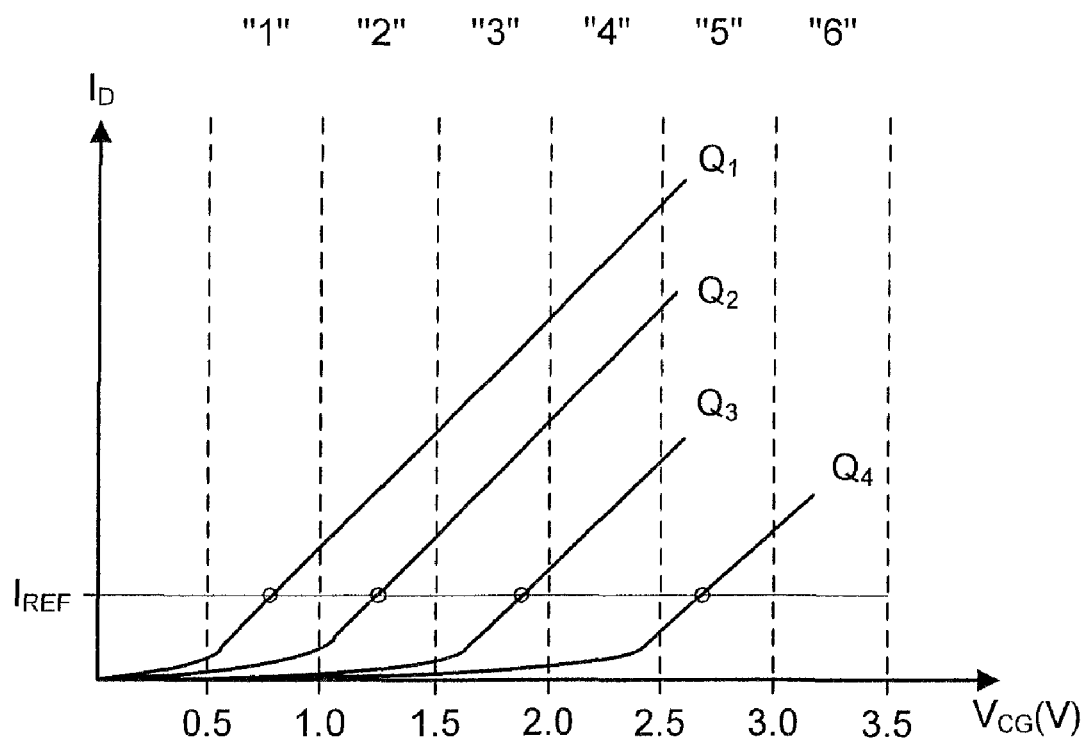
FIG. 4 illustrates the relation between the source-drain current and the control gate voltage for four different charges Q1-Q4 that the floating gate may be storing at any one time.
Figure 5:
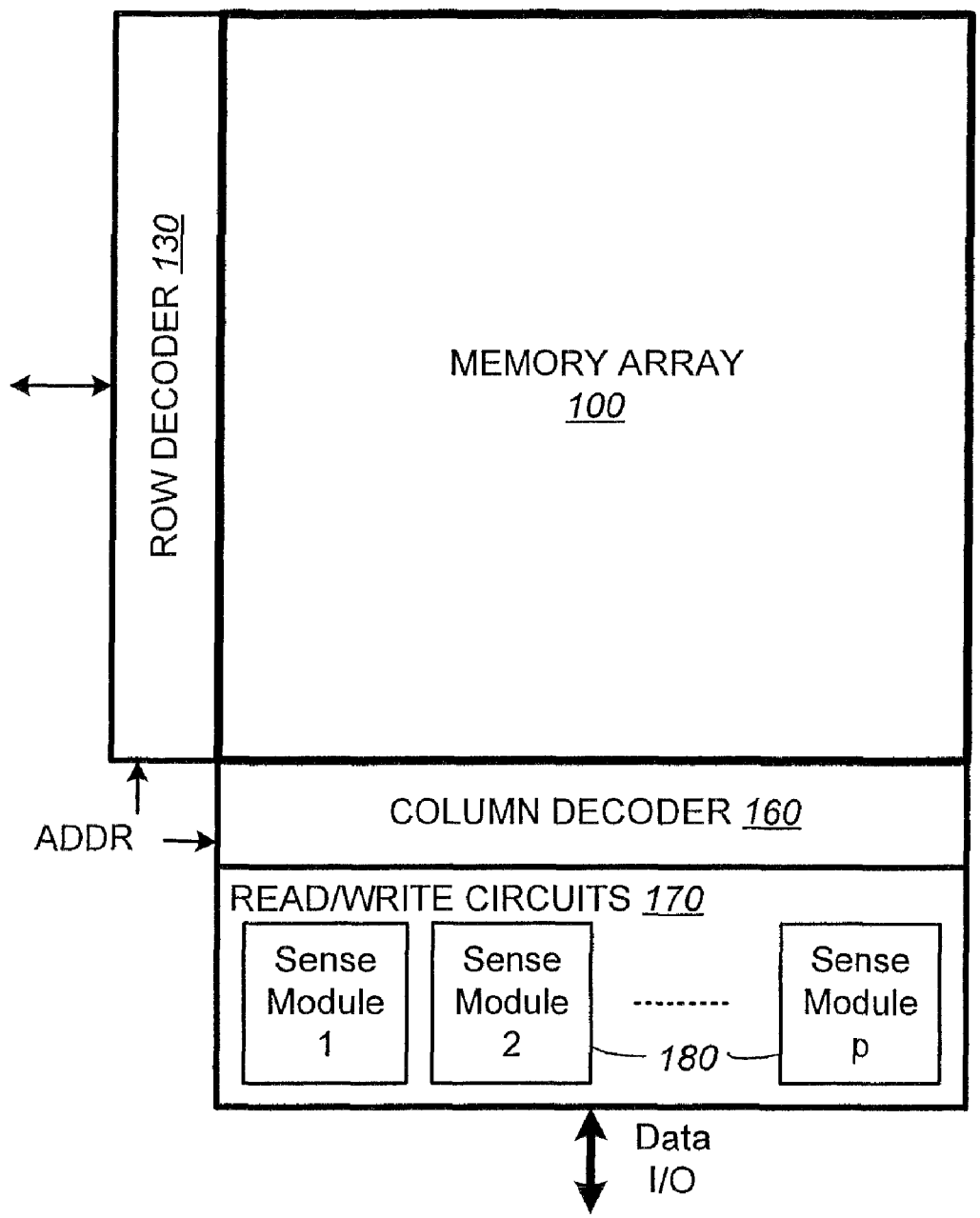
FIG. 5 illustrates schematically a typical arrangement of a memory array accessible by read/write circuits via row and column decoders.
Figure 6A:
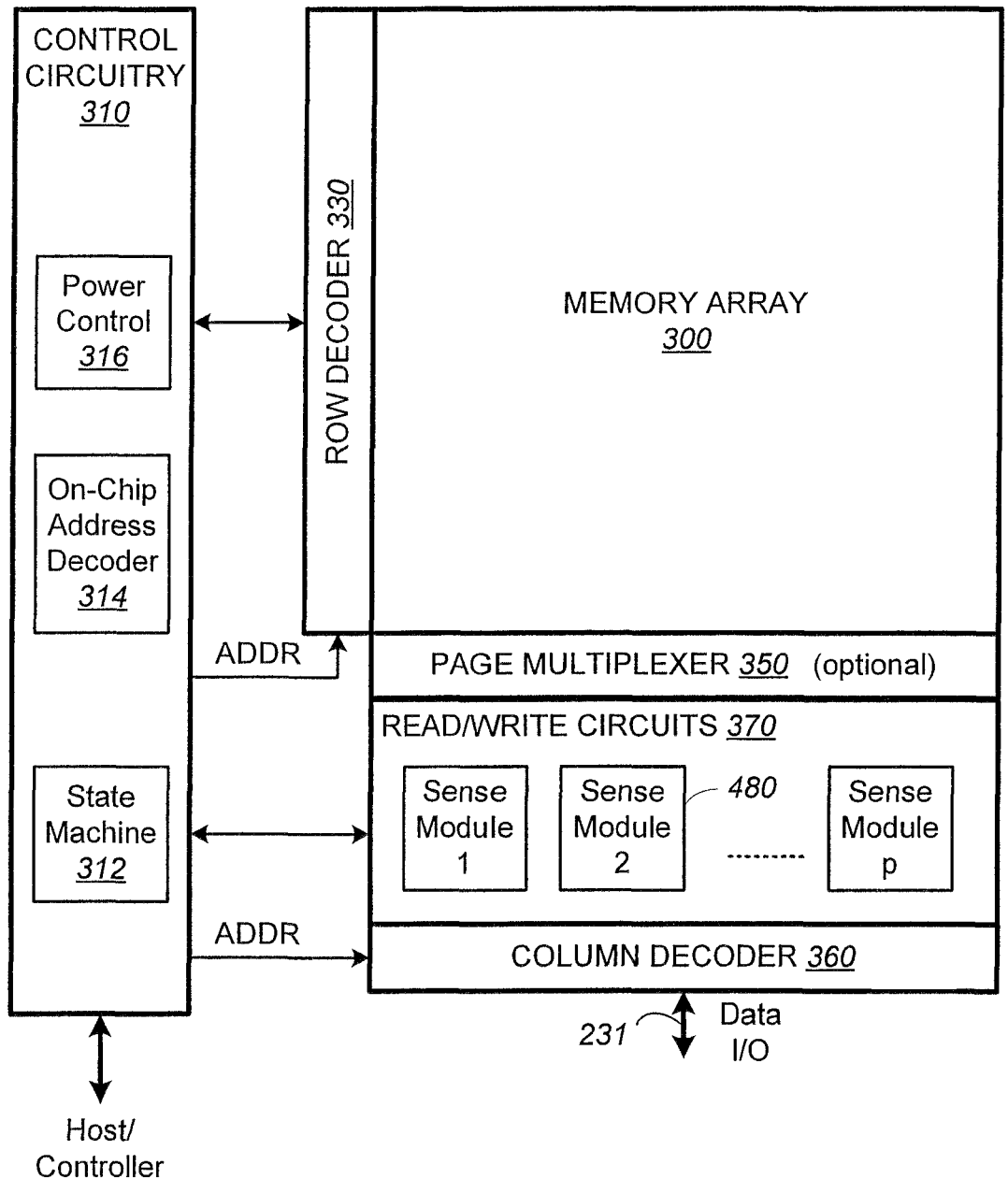
FIG. 6A illustrates schematically a compact memory device having a bank of read/write circuits, which provides the context in which the present invention is implemented.

FIG. 6A illustrates schematically a compact memory device having a bank of read/write circuits, which provides the context in which the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of sense modules 480 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 6B:
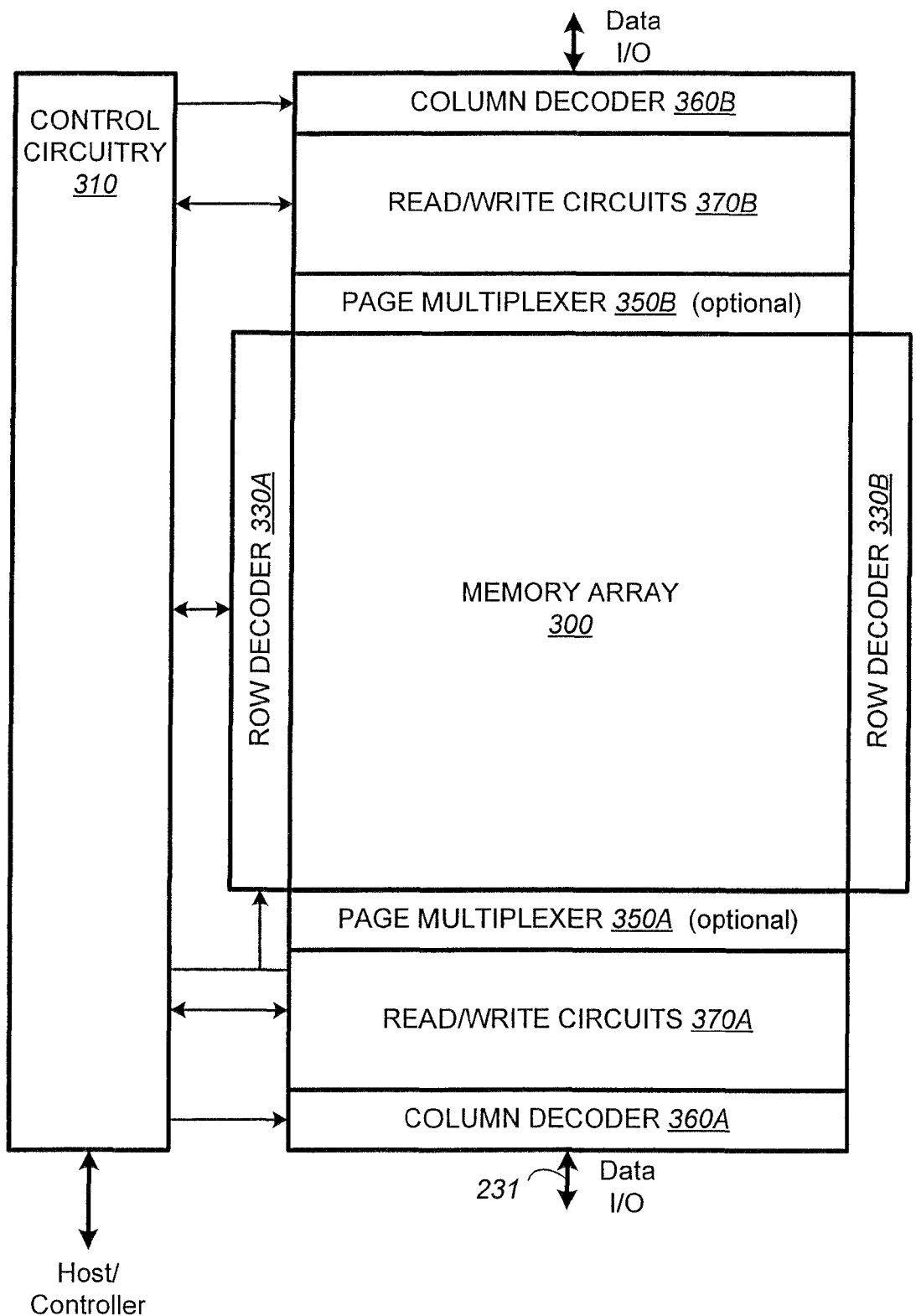
FIG. 6B illustrates a preferred arrangement of the compact memory device shown in FIG. 6A.

FIG. 6B illustrates a preferred arrangement of the compact memory device shown in FIG. 6A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the bank of sense modules 480, is essentially reduced by one half.

The entire bank of p sense modules 480 operating in parallel allows a block (or page) of p cells along a row to be read or programmed in parallel. One example memory array may have p=512 bytes (512×8 bits). In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module includes a sense amplifier for sensing the conduction current of a memory cell. A preferred sense amplifier is disclosed in United States Patent Publication No. 2004-0109357-A1, the entire disclosure of which is hereby incorporated herein by reference.

Examples of Reading and Programming for Multistate Memory

FIGS. 7A-7E, 8A-8E, 9A-9E respectively illustrate three examples of multi-bit encoding for a 4-state memory. In a 4-state memory cell, the four states can be represented by two bits. One existing technique is to use a 2-round programming to program such memory. A first bit (lower page bit) is programmed by a first round. Subsequently, the same cell is programmed in a second round to represent a desired second bit (upper page bit). In order not to change the value of the first bit in the second round, the memory state representation of the second bit is made to depend on the value of the first bit.

FIGS. 7A-7E illustrate the programming and reading of the 4-state memory encoded with a conventional 2-bit Gray code. The memory cell's range of programmable threshold voltages (threshold window) is partitioned into four regions, representing an unprogrammed "U" state, and three other increasingly programmed states, "A", "B" and "C". The four regions are demarcated respectively by demarcation threshold voltages $D_A$, $D_B$ and $D_C$.

Figure 7A:
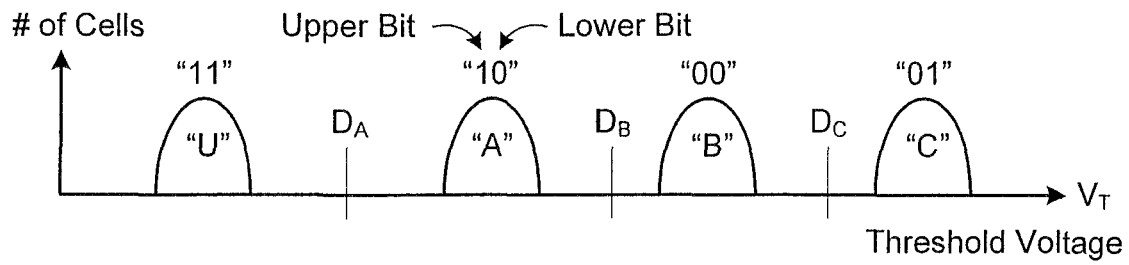
FIG. 7A illustrates threshold voltage distributions of the 4-state memory array when each memory cell stores two bits of data using a conventional Gray code.

FIG. 7A illustrates threshold voltage distributions of the 4-state memory array when each memory cell stores two bits of data using a conventional Gray code. The four distributions represent the population of the four memory states, "U", "A", "B" and "C". Before a memory cell is programmed, it is first erased into its "U" or "unprogrammed" state. The memory states "A", "B" and "C" are progressively reached as the memory cell get increasingly programmed. The Gray code uses the (Upper bit, Lower bit) to designate "U" as (1, 1), "A" as (1, 0), "B" as (0, 0) and "C" as (0, 1)

Figure 7B:
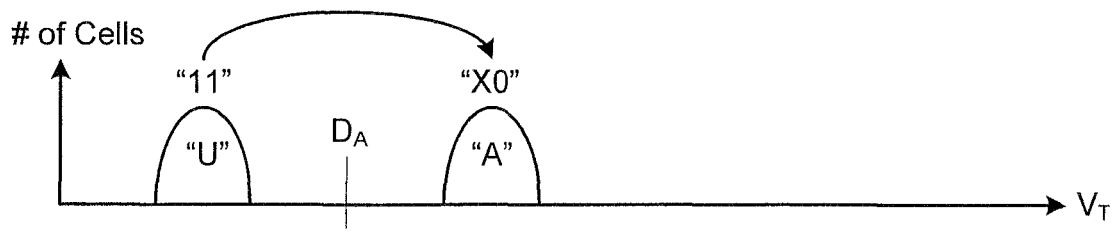
FIG. 7B illustrates the lower page programming in an existing, 2-round programming scheme using the Gray code.

FIG. 7B illustrates the lower page programming in an existing, 2-round programming scheme using the Gray code. For a page of cells to be programmed in parallel, the upper and lower bits will give rise to two logical pages: a logical lower page consisting of the lower bits and a logical upper page consisting of the upper bits. A first programming round only programs the logical lower page bits. By appropriate coding, a subsequent, second programming round on the same page of cells will program the logical upper page bits without resetting the logical lower page bits. The Gray code is a commonly used code where only one bit changes when transiting to an adjacent state. Therefore, this code has the advantage of placing less demand on error correction since only one bit is involved.

A general scheme in using the Gray code is to let "1" represent a "not program" condition. Thus, the erased memory state "U" is represented by (Upper page bit, Lower page bit)=(1, 1). In a first round to program the logical lower page, any cell to store the bit "0" will therefore have its logical state transit from (x, 1) to (x, 0), where "x" represent the "don't care" value of the upper bit. However, since the upper bit has not been programmed yet, "x" may as well be labeled by "1" for consistency. The (1, 0) logical state is represented by programming the cell to the memory state "A". That is, prior to a second program round, the lower bit value of "0" is represented by the memory state "A".

Figure 7C:
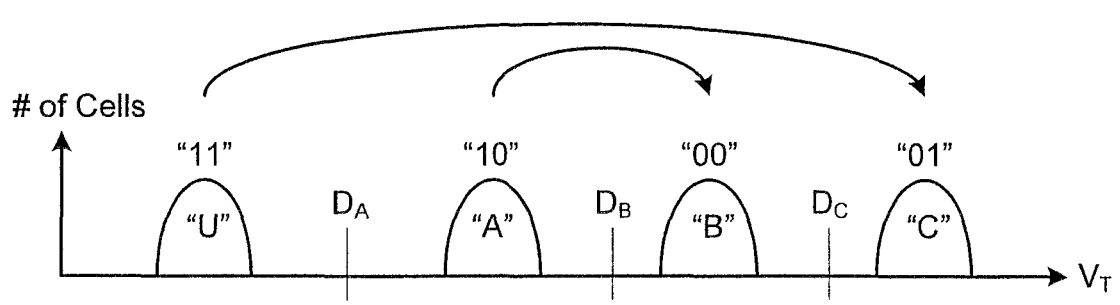
FIG. 7C illustrates the upper page programming in an existing, 2-round programming scheme using the Gray code.

FIG. 7C illustrates the upper page programming in an existing, 2-round programming scheme using the Gray code. A second round programming is performed to store the bits of the logical upper page. Only those cells needing an upper page bit value of "0" will be programmed. After the first round, the cells in the page are either in the logical state (1, 1) or (1, 0). In order to preserve the values of the lower page in the second round, the lower bit value of "0" or "1" need to be distinguished. For the transition from (1, 0) to (0, 0) the memory cell in question is programmed to the memory state "B". For the transition from (1, 1) to (0, 1) the memory cell in question is programmed to the memory state "C". In this way, during read, by determining the memory state programmed in a cell, both the lower page bit and the upper page bit can be decoded.

Programming is accomplished by alternately applying a programming pulse to a page of memory cells in parallel followed by sensing or program verifying on each of the cells to determine if any of them has been programmed to their target states. Whenever a cell has been program verified, it is locked out or program inhibited from further programming even as the programming pulses continue to be applied to complete the programming of the other cells in the group. It can be seen from FIGS. 7B and 7C that during the lower page programming, program verification need be performed relative to state "A" (denoted by "verifyA") with the demarcation threshold voltage $D_A$. However, for the upper page programming, program verification need be performed relative to states "B" and "C". Thus, the upper page verify will require a 2-round verify of "verifyB and "verifyC", respectively relative to the demarcation threshold voltages $D_B$ and $D_C$.

Figure 7D:
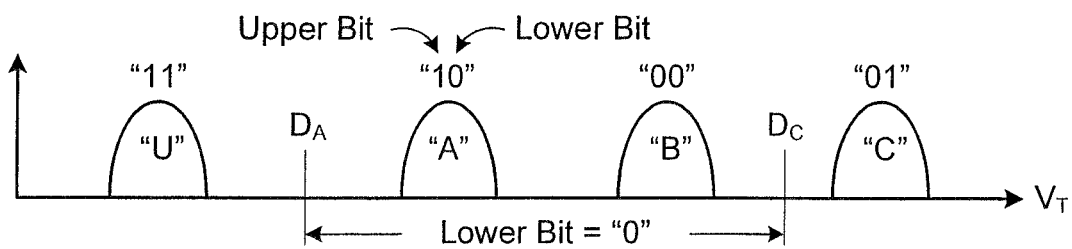
FIG. 7D illustrates the read operation that is required to discern the lower bit of the 4-state memory encoded with the Gray code.

FIG. 7D illustrates the read operation that is required to discern the lower bit of the 4-state memory encoded with the Gray code. Since the memory states "A" encoded by (1, 0) and "B" encoded by (0, 0) both have "0" as their lower bits, the lower bit "0" will be detected whenever a memory cell is programmed to either states "A" or "B". Conversely, the lower bit "1" will be detected whenever a memory cell is unprogrammed at state "U" or programmed to state "C". Thus, the lower page read will require a 2-round read of readA and readC, respectively relative to the demarcation threshold voltages $D_A$ and $D_C$.

Figure 7E:
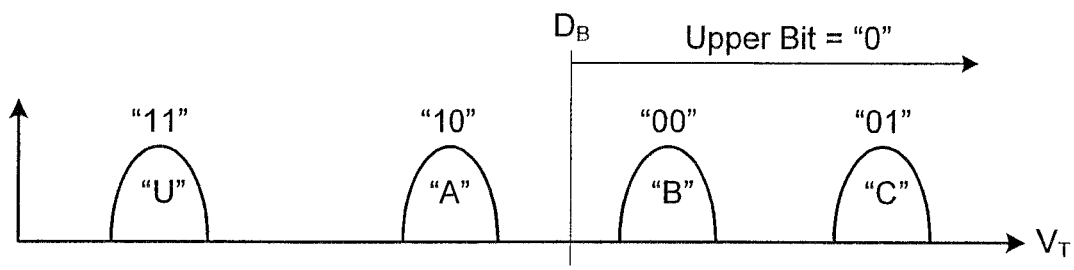
FIG. 7E illustrates the read operation that is required to discern the upper bit of the 4-state memory encoded with the Gray code.

FIG. 7E illustrates the read operation that is required to discern the upper bit of the 4-state memory encoded with the Gray code. It will require one read pass of readB relative to the demarcation threshold voltage $D_B$. In this way, any cells with programmed threshold voltages less than $D_B$ will be detected to be at memory state "1" and vice versa.

The Gray-code, 2-round programming scheme can become a problem when the second-round programming is erroneous. For example, the programming of the upper page bit to "0" while the lower bit is at "1" will cause the transition from (1, 1) to (0, 1). This requires the memory cell to be progressively programmed from "U" through "A" and "B" to "C". If there is a power outage before the completion of the programming, the memory cell may end up in one of the transition memory state, say "A". When the memory cell is read, "A" will be decoded as the logical state (1, 0). This gives incorrect results for both the upper and lower bits, since it should have been (0, 1). Similarly, if the programming is interrupted when "B" is reached, it would correspond to (0, 0). While the upper bit is now correct, the lower bit is still wrong. Furthermore, because of the possible transition from the unprogrammed state "U" all the way to the most programmed state "C", this code scheme has the effect of exacerbating the potential differences between charge levels of adjacent cells programmed at different times. Thus, it also exacerbates the field-effect coupling ("Yupin Effect") between adjacent floating gates.

Figure 8A:
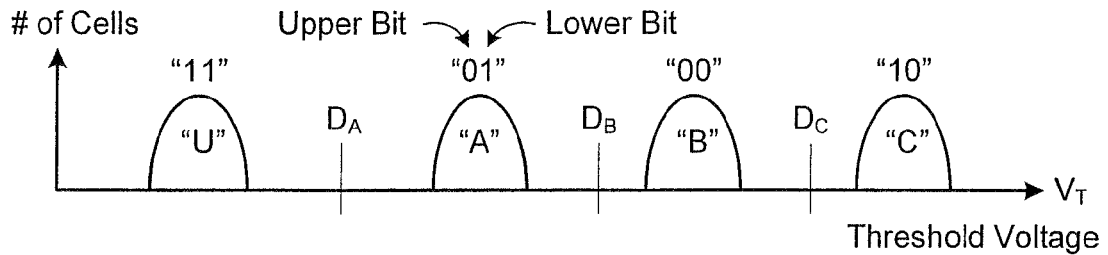
FIG. 8A illustrates threshold voltage distributions of the 4-state memory array when each memory cell stores two bits of data using the LM code.

FIGS. 8A-8E illustrate the programming and reading of the 4-state memory encoded with another logical code ("LM" code). This code provides more fault-tolerance and alleviates the neighboring cell coupling due to the Yupin Effect. FIG. 8A illustrates threshold voltage distributions of the 4-state memory array when each memory cell stores two bits of data using the LM code. The LM coding differs from the conventional Gray code shown in FIG. 7A in that the upper and lower bits are reversed for states "A" and "C". The "LM" code has been disclosed in U.S. Pat. No. 6,657,891 and is advantageous in reducing the field-effect coupling between adjacent floating gates by avoiding program operations that require a large change in charges.

Figure 8B:
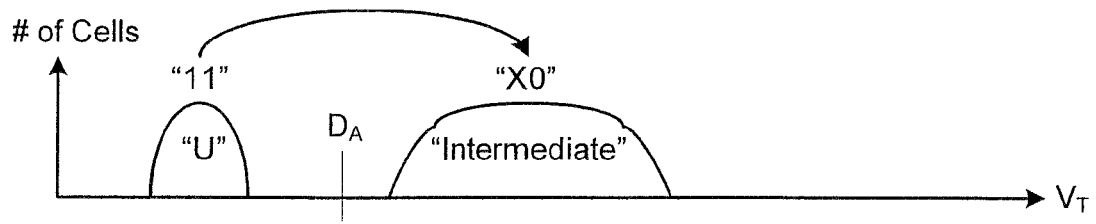
FIG. 8B illustrates the lower page programming in an existing, 2-round programming scheme using the LM code.

FIG. 8B illustrates the lower page programming in an existing, 2-round programming scheme using the LM code. The fault-tolerant LM code essentially avoids any upper page programming to transit through any intermediate states. Thus, the first round lower page programming has the logical state (1, 1) transits to some intermediate state (x, 0) as represented by programming the "unprogrammed" memory state "U" to an "intermediate" state designated by (x, 0) with a programmed threshold voltage among a broad distribution that is greater than $D_A$ but less than $D_C$.

Figure 8C:
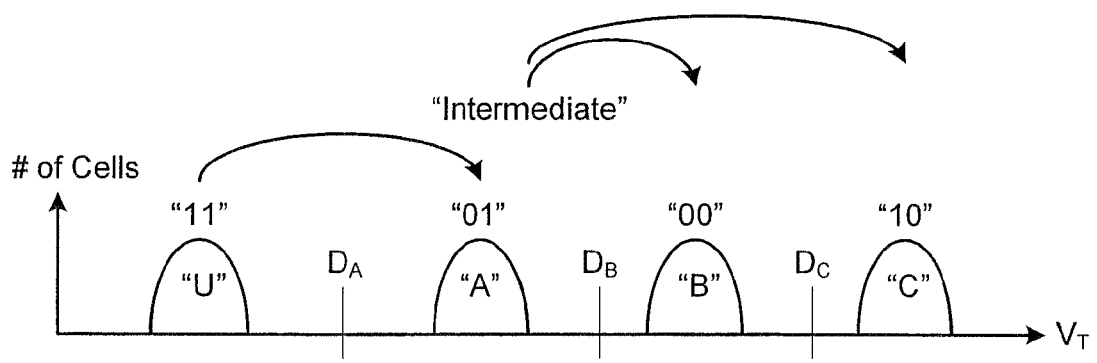
FIG. 8C illustrates the upper page programming in an existing, 2-round programming scheme using the LM code.

FIG. 8C illustrates the upper page programming in an existing, 2-round programming scheme using the LM code. In the second round of programming the upper page bit to "0", if the lower page bit is at "1", the logical state (1, 1) transits to (0, 1) as represented by programming the "unprogrammed" memory state "U" to "A". If the lower page bit is at "0", the logical state (0, 0) is obtained by programming from the "intermediate" state to "B". Similarly, if the upper page is to remain at "1", while the lower page has been programmed to "0", it will require a transition from the "intermediate" state to (1, 0) as represented by programming the "intermediate" state to "C". Since the upper page programming only involves programming to the next adjacent memory state, no large amount of charges is altered from one round to another. The lower page programming from "U" to a rough "intermediate" state is designed to save time. However, this will result in the "LM" code equally vulnerable to the upper page program error or power outage during upper page programming. For example, the state "A" may move to the threshold voltage which can not be distinguished from the "intermediate" state.

Figure 8D:
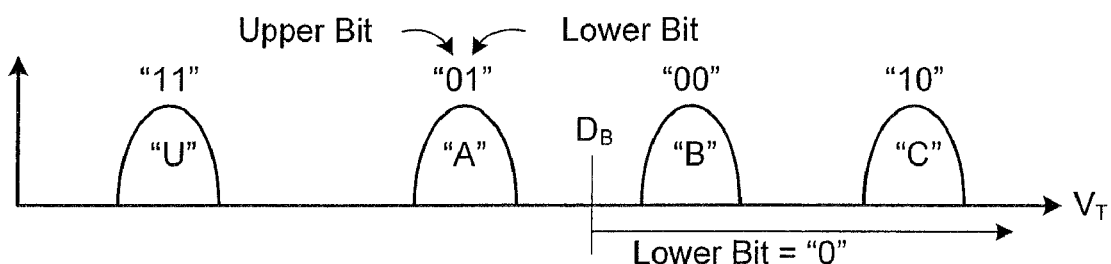
FIG. 8D illustrates the read operation that is required to discern the lower bit of the 4-state memory encoded with the LM code.

FIG. 8D illustrates the read operation that is required to discern the lower bit of the 4 state memory encoded with the LM code. The decoding will depend on whether the upper page has been programmed or not. If the upper page has been programmed, reading the lower page will require one read pass of readB relative to the demarcation threshold voltage $D_B$. On the other hand, if the upper page has not yet been programmed, the lower page is programmed to the "intermediate" state (FIG. 8B), and readB will cause error. Rather, reading the lower page will require one read pass of readA relative to the demarcation threshold voltage $D_A$. In order to distinguish the two cases, a flag ("LM" flag) is written in the upper page when the upper page is being programmed. During a read, it will first assume that the upper page has been programmed and therefore a readB operation will be performed. If the LM flag is read, then the assumption is correct and the read operation is done. On the other hand, if the first read did not yield a flag, it will indicate that the upper page has not been programmed and therefore the lower page would have to be read by a readA operation.

Figure 8E:
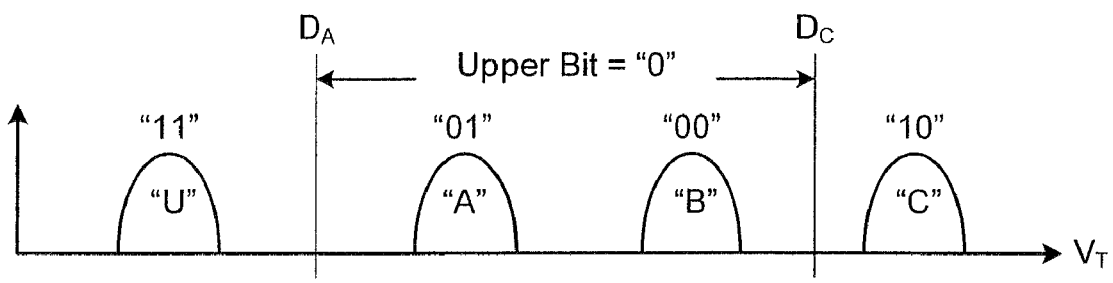
FIG. 8E illustrates the read operation that is required to discern the upper bit of the 4-state memory encoded with the LM code.

FIG. 8E illustrates the read operation that is required to discern the upper bit of the 4-state memory encoded with the LM code. As is clear from the figure, the upper page read will require a 2-pass read of readA and readC, respectively relative to the demarcation threshold voltages $D_A$ and $D_C$. Similarly, the decoding of upper page can also be confused by the "intermediate" state if the upper page is not yet programmed. Once again the LM flag will indicate whether the upper page has been programmed or not. If the upper page is not programmed, the read data will be reset to "1" indicating the upper page data is not programmed.

The LM code can also become a problem in a memory that supports partial page programming. While a page of memory cells are programmed or read in parallel, partial page programming allows a portion of the page to be programmed in one round and the unprogrammed remaining portion to be programmed in a subsequent round. The LM code presents a problem in a programming operation where an upper page is only partially filled with data. In a subsequent upper page programming to complete the partially unfilled page, the data may be programmed to the wrong states. By convention a "1" bit represents a "no program" condition and therefore both the lower and upper bits default to "1" initially in the unprogrammed "U" state. The upper page bit should be "1" representing cells in the unfilled portion. If the lower page bit for a cell in the unfilled portion happens to be "1", the resulting logical state (1, 1) will have the cell remain at "U". However, if the lower page bit is "0", it would result in the logical state (1, 0) which will cause the cell to be programmed to the most programmed (highest threshold voltage) "C" state. A subsequent programming round to complete the unfilled portion can no longer entertain the possibility of getting to the (0, 0) or "B" state since it is not possible to roll back to a less programmed state from "C".

Figure 9D:
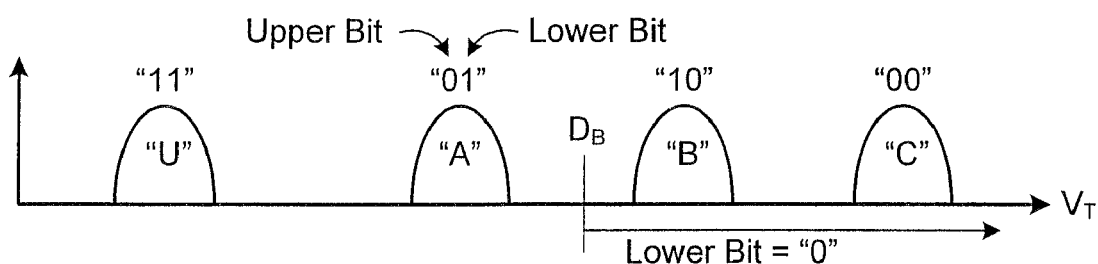
FIG. 9D illustrates the read operation that is required to discern the lower bit of the 4-state memory encoded with the LM New code.

FIGS. 9A-9E illustrate the programming and reading of the 4-state memory encoded with a preferred, logical code ("LM New" code). The LM New code is similar to the LM code but without the disadvantages described above. FIG. 9A illustrates threshold voltage distributions of the 4-state memory array when each memory cell stores two bits of data using the LM New code. The LM New code has been disclosed in US Patent Publication No. 2005-0237814 A1, dated Oct. 27, 2005 by Li et al., entitled "NON-VOLATILE MEMORY AND CONTROL WITH IMPROVED PARTIAL PAGE PROGRAM CAPABILITY". The code differs from the LM code shown in FIG. 8A in that the logical coding for states "B" and "C" are interchanged. Thus the (Upper bit, Lower bit) for "U" is (1, 1), for "A" is (0, 1), for "B" is (1, 0) and for "C" is (0, 0). This coding avoids the problem of partial page programming in the LM code described above since the partially unfilled upper page is now programmed to the "B" state when the lower bit is at "0". Subsequent programming of the partially unfilled portion will allow programming from the (1, 0) to the (0, 0) logical state, which corresponds to programming from the "B" to the "C" state.

FIG. 9B illustrates the lower page programming in an existing, 2-round programming scheme using the LM New code. The fault-tolerant LM New code essentially avoids any upper page programming to transit through any intermediate states. Thus, the first round lower page programming has the logical state (1, 1) transits to some intermediate state (x, 0) as represented by programming the "unprogrammed" memory state "U" to the "intermediate" state designated by (x, 0) with a programmed threshold voltage greater than $D_A$ but less than $D_C$. FIG. 9C illustrates the upper page programming in an existing, 2-round programming scheme using the LM New code. In the second round of programming the upper page bit to "0", if the lower page bit is at "1", the logical state (1, 1) transits to (0, 1) as represented by programming the "unprogrammed" memory state "U" to "A". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate" state to "B".

FIG. 9D illustrates the read operation that is required to discern the lower bit of the 4-state memory encoded with the LM New code. The same consideration applies here as in the case for the LM code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 9E:
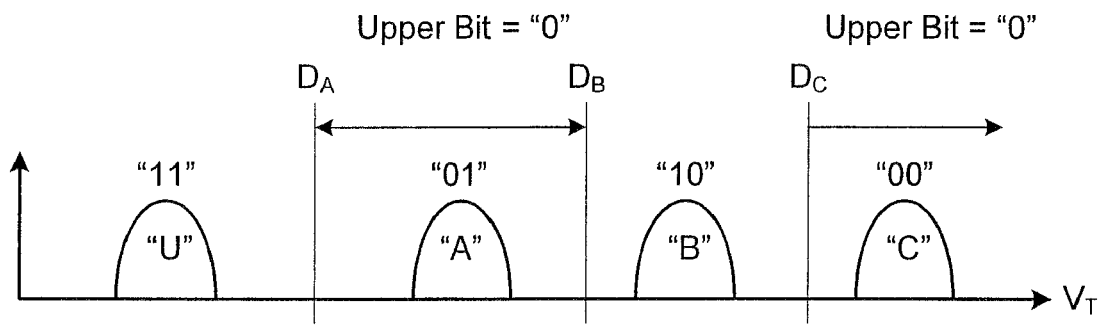
FIG. 9E illustrates the read operation that is required to discern the upper bit of the 4-state memory encoded with the LM New code.

FIG. 9E illustrates the read operation that is required to discern the upper bit of the 4-state memory encoded with the LM New code. As is clear from the figure, the upper page read will require a 3-pass read of readA, readB and readC, respectively relative to the demarcation threshold voltages $D_A$, $D_B$ and $D_C$. The decoding of the upper page has the same consideration described with regard to the LM flag for the LM code above.

The discussion of the various codes above for an example 4-state memory shows that a read operation can involve a single sensing pass as in "readB" which is comparing the programmed threshold voltage relative to the demarcation threshold voltage $D_B$. The readB operation is applicable for reading the upper page under the conventional Gray code or the lower page under the LM code or the lower page under the LM new code.

A read operation can also involve a 2-pass read as in readA and readC in reading the lower page under the conventional Gray code or the upper page under the LM code.

A read operation can also involve a 3-pass read as in readA, readB and readC in reading the upper page under the LM New code.

Figure 10:
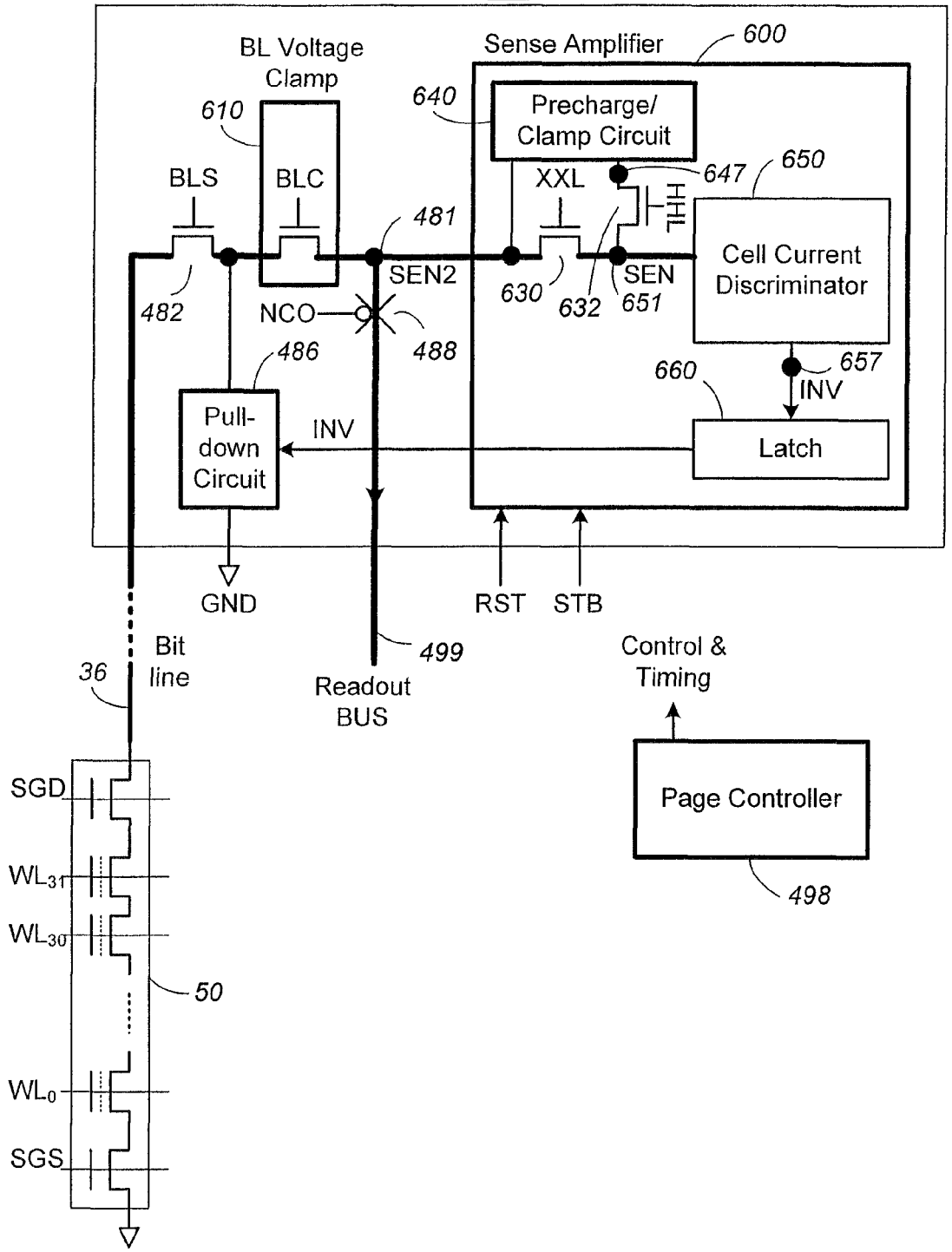
FIG. 10 illustrates schematically in more detail the sense module shown in FIG. 6A that is suitable for sensing the memory.

FIG. 10 illustrates schematically in more detail the sense module shown in FIG. 6A that is suitable for sensing the memory. The sense module 480 senses the conduction current of a memory cell in a NAND chain 50 via a coupled bit line 36. It has a sense node 481 that can be selectively coupled to a bit line, a sense amplifier 600 and a readout bus 499. Initially, an isolation transistor 482, when enabled by a signal BLS connects the bit line 36 to the sense node 481. The sense amplifier 600 senses the sense node 481. The sense amplifier includes a precharge/clamp circuit 640, a cell current discriminator 650 and a latch 660. The sense module 480 enables the conduction current of the selected memory cell in the NAND chain to be sensed.

Prior to sensing, the voltages to the gates of the selected memory cell must be set via the appropriate word lines and bit line. As will be described in more detail later, the precharge operation starts with the unselected word line charging to a voltage Vread followed by charging the selected world line to a predetermined threshold voltage $V_T(i)$ for a given memory state under consideration. Then the precharge circuit 640 brings the bit line voltage to a predetermined drain voltage appropriate for sensing. This will induce a source-drain conduction current to flow in the selected memory cell in the NAND chain 50, which is detected from the channel of the NAND chain via a coupled bit line 36. The conduction current is a function of the charge programmed into the memory cell and the applied $V_T(i)$ when there exists a nominal voltage difference between the source and drain of the memory cell.

Figure 11A:
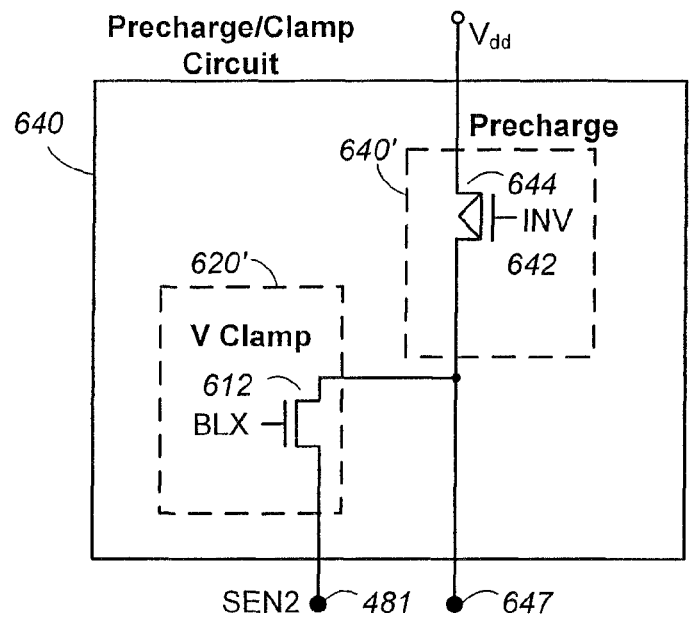
FIG. 11A illustrates in more detail the Precharge/Clamp circuit shown in FIG. 10.

FIG. 11A illustrates in more detail the Precharge/Clamp circuit shown in FIG. 10. The circuit has a voltage clamp 620' component and a precharge circuit 640' component. The voltage clamp 620' is implemented by a transistor 612 controlled by an analog signal BLX at its gate. BLX is such that it ensures sufficient voltage on the node SEN2 481 (see FIG. 10) so that the bit line voltage clamp 610 can function properly.

When the $V_T(i)$ voltage is stable, the conduction current or the programmed threshold voltage of the selected memory cell can be sensed via the coupled bit line 36 via the transistor 630 gated by a signal XXL. The cell current discriminator 650 serves as a discriminator or comparator of current levels. It is coupled to the sense node to sense the conduction current in the memory cell.

Figure 11B:
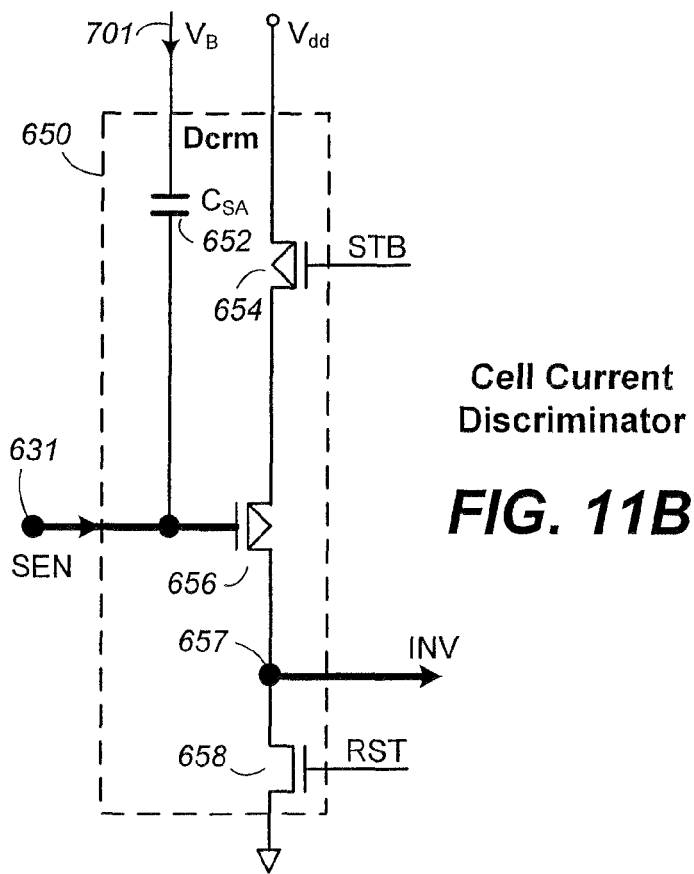
FIG. 11B illustrates in more detail the cell current discriminator circuit shown in FIG. 10.

FIG. 11B illustrates in more detail the cell current discriminator circuit shown in FIG. 10. The cell current discriminator 650' includes a capacitor 652 and a p-channel transistor 656. The cell current discriminator essentially measures the conduction current of a memory storage unit by the rate it charges or discharges the capacitor 652. This is accomplished by sensing the signal SEN at the node 631. The signal SEN controls the gate of the p-transistor 656. Prior to sensing, SEN is precharged to $V_{dd}$ (HIGH) by the precharge circuit 640'. Referring also to FIG. 10, the precharged is enabled by a signal HHL turning on the coupling transistor 632 so that the node SEN 651 is coupled to the precharge circuit at node 647. This will initially set the voltage across the capacitor 652 to be zero. Sensing is to measure the cell's conduction current by the rate it discharges the capacitor.

During sensing, the conduction current of the memory storage unit in the bit line will discharge the capacitor 652. The voltage in the node SEN will then decrease from $V_{dd}$ at a rate depending on the conduction current. After a predetermined discharging period, the period being corresponding to a reference current, SEN will drop to some value that may or may not turn on the measuring p-transistor 656. If it drops sufficiently low to turn on the p-transistor 656, it will mean that the conduction current is higher than the reference current. On the other hand, if the transistor 656 is not turned on at the end of the sensing period, the conduction current is lower than the reference current. The end of the sensing period is marked by decoupling the bit line from the SEN node with XXL turning off the coupling transistor 630. The sensed result is then latched into the latch 650 by a strobe signal STB.

The cell current discriminator 650 effectively determines whether the cell's conduction current is higher or lower than a given demarcation current value. The given demarcation current value corresponds to a predetermined discharge time. If it is higher, the latch 660 is set to a predetermined state with the signal INV=1 (HIGH).

A pull-down circuit 486 is activated in response to the latch 660 setting the signal INV to HIGH. This will pull down the sense node 481 and therefore the connected bit line 36 to ground voltage. This will inhibit the conduction current flow in the memory cell 10 irrespective of the control gate voltage since there will be no voltage difference between its source and drain.

In general, there will be a page of memory cells being operated on by a corresponding number of multi-pass sense modules 480. A page controller 498 supplies control and timing signals to each of the sense modules. The page controller 498 cycles each of the multi-pass sense module 480 through a predetermined number of passes (j=1 to N) and also supplies a predetermined demarcation current value $I_0(j)$ for each pass. As is well known in the arts, the demarcation current value can also be implemented as a demarcation threshold voltage, or time period for sensing. After the last pass, the page controller 498 enables a transfer gate 488 with a signal NCO to read the state of the sense node 481 as sensed data to a readout bus 499. In all, a page of sense data will be read out from all the multi-pass modules 480. Similar sense modules have been disclosed in US Patent Publication No. 2005-0169082-A1, dated Aug. 4, 2005 by Cernea et al., entitled "IMPROVED MEMORY SENSING CIRCUIT AND METHOD FOR LOW VOLTAGE OPERATION". The entire disclosure of US Patent Publication No. 2005-0169082-A1 is incorporated herein by reference.

Power-Saving Considerations

Power-saving techniques have been disclosed in U.S. patent application Ser. No. 11/083,514 filed Mar. 16, 2005 by Li et al., entitled "NON-VOLATILE MEMORY AND METHOD WITH POWER-SAVING READ AND PROGRAM-VERIFY OPERATIONS", which disclosure is incorporated herein by reference. In particular, a read or program verify operation includes one or more sensing passes corresponding to one or more demarcation threshold voltages to determine a memory state. Each pass is for sensing relative to a demarcation threshold voltage, and operates on a page of memory cells in parallel. A sensing pass typically includes more than one cycle of sensing operation to resolve the memory states of all the cells in the page. In one aspect, a first cycle senses and identifies as much as possible those memory cells among the page with the highest conduction currents. This will minimize any errors in sensing during a subsequent sub-cycle due to the presence of these high currents cells. Since these cells have already been read, their conduction currents are turned off to save power. In a subsequent sub-cycle, the remaining memory cells of the page will be sensed again in parallel with reduced interference from the higher current cells. In another aspect, a power-consuming period is minimized by preemptively starting any operations that would prolong the period. In a program/verify operation, cells not to be programmed have their bit lines charged up in the program phase. Power is saved when a set of these bit lines avoids re-charging at every passing of a program phase.

Additional Power-Saving Considerations According to the Present Invention

According to one aspect of the invention, power-saving in a sensing cycle for a page of memory cells is effected by minimizing the draining effect of the memory cells during a precharge operation. This is accomplished by first charging the bit lines without coupling to the memory cells. After the bit lines have been charged to a predetermined degree will the memory cells be coupled thereto to reach a final steady state condition before sensing is to take place.

According to another aspect of the present invention, power-saving in a sensing cycle for a page of memory cells is effected by reducing the precharge period before the actual sensing. Before sensing is to take place, the voltages on the word line and the bit lines need be set up by a precharge operation. The precharge operation consumes power and yet must be of sufficient duration so that the voltages will become sufficient stable before accurate sensing can take place. The invention calls for reducing the precharge period even beyond the point where the voltages are no longer sufficiently stable for accurate sensing relative to an original reference level. This is applicable in a sensing cycle which completion takes more than one sensing sub-cycle. When the precharge in the first sub-cycle consumes more power than a subsequent sub-cycle, and the precharge period of the first is reduced to save power at the expense of the subsequent sub-cycle, overall power is saved among the two sub-cycles.

In a preferred embodiment, a first sensing sub-cycle is employed to identify the highest current states so that they could be removed from the page being sensed in order to minimize any ground loop or source bias errors. With the high current cells of the page turned off, a second sensing sub-cycle will be able to sense the remaining cells of the page with better accuracy. Since the precharge for setting up the first sensing sub-cycle consumes relative more power due to the presence of more of the higher current cells, this precharge period is reduced to save power. The prematurely shortened precharge period, before the bit lines voltage has stabilized will result in less accurate sensing. In order not to erroneously detect the lower current cells as high current cells due to the presence of transient displacement currents before the bit line stabilized, the discrimination current level is set higher to provide a safe margin. This will result in detecting less of the higher current cells as compared to sensing after the bit line voltage has stabilized. Those higher current cells that should have been detected but fail to be detected would be caught in a subsequent second sensing sub-cycle. However, their cell current was not turned off and would make the precharge drain more power in the second sub-cycle. It will also introduce a bit more ground loop bias voltage error during the second sensing.

Power-Saving and Neighbor Interactions in all-Bit Line Architecture

One of the complications in sensing a page where the memory cells are contiguous along a row (the so-called "all-bit-line" architecture) is the coupling between neighbors. As described in the background section of the specification, one way of minimizing the couplings is to keep the bit-line voltages constant during sensing. However, power consumption becomes more of an issue for the all-bit-line architecture for several reasons.

First, there is potentially twice the number of memory cells operating in parallel than that of the alternate bit-line architecture.

Secondly, to maintain a constant voltage on the bit line, it is precharged while connected to the cell which is draining current. This means that in the precharge operation, power is expended not only to charge up the bit line but also to work against the draining cell current.

A third reason for power consumption is that the precharge period must be extended until the bit lines have all become stable before accurate sensing can take place. The bit lines and word lines behave as capacitive loads. When a bit line is being precharged, an alternating current ("AC") displacement current will flow initially and eventually decay to zero as the bit line becomes charged to the applied voltage. The decay time is a function of the RC constant of the effective capacitance. Since sensing a cell is essentially to determine its direct current ("DC") conduction current, accurate sensing in the bit line can only commence after the AC displacement current has subsided.

The AC displacement current flowing in the bit line being sensed can be regarded as coming from two contributors. One is due to the charging of the capacitance of the bit line being sensed itself. The other, which is also the greater contributor, is due to the charging of the cross-coupling capacitance with its neighbors.

Figure 12:
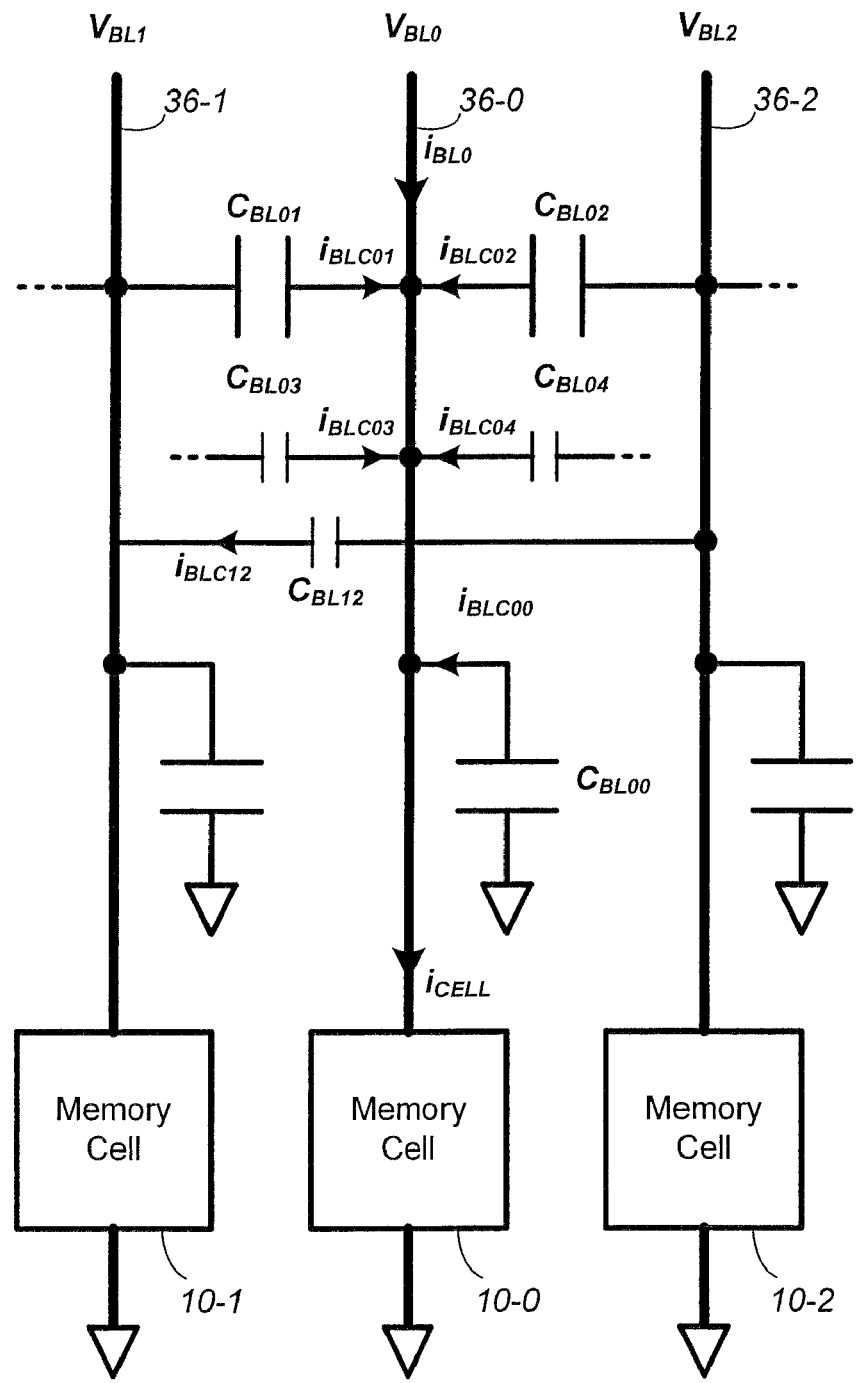
FIG. 12 illustrates three adjacent bit lines and the effect of capacitive couplings between them.

FIG. 12 illustrates three adjacent bit lines and the effect of capacitive couplings between them. A memory cell 10-0 has two adjacent memory cells, 10-1 and 10-2. Similarly, coupled to the three memory cells are respectively three adjacent bit lines 36-0, 36-1 and 36-2. Each of the bit lines has its own self capacitance $C_{BL0}$, $C_{BL1}$ and $C_{BL2}$ respectively. The pair of adjacent bit lines 36-0 and 36-1 has mutual capacitance $C_{BL01}$. The pair of adjacent bit lines 36-0 and 36-1 has mutual capacitance $C_{BL02}$.

It can then be seen, there could be various branches of current flow due to the various capacitances. In particular, the currents due to each bit line self capacitance will result in:

$$i_{BLC0} = C_{BL0} d/dt V_{BL0},$$

$$i_{BLC1} = C_{BL1} d/dt V_{BL1},$$

$$i_{BLC2} = C_{BL2} d/dt V_{BL2}.$$

Similarly, the cross current due to the pair of adjacent bit lines 36-0 and 36-1 is:

$$i_{BLC01} = C_{BL01} d/dt (V_{BL0} - V_{BL1}), \text{ and}$$

$$i_{BLC02} = C_{BL02} d/dt (V_{BL0} - V_{BL2}).$$

For the memory cell 10-0, the cell's conduction current is:

$$i_{CELL} \sim i_{BL0} + [i_{BLC00} + i_{BLC01} + i_{BLC02}].$$

The cell current given above is an approximation since it only includes contributions from adjacent bit lines. In general, for the bit line BL0 there will also be capacitance $C_{BL0}$, due to the non adjacent bit lines to the left as well as capacitance $C_{BL04}$ due to the non adjacent bit lines to the right. Similarly, there will be a mutual capacitance $C_{BL12}$ between non adjacent bit lines BL1 and BL2. These capacitances will contribute to displacement current flow dependent on a varying voltage across each capacitor. It has been estimated that the contributions from non adjacent bit lines amount to about ten percent of the contribution from the adjacent bit lines.

As for charging the bit line capacitance, the more current in the bit line, the higher the voltage will the bit line be charged up to for a given period. The net current for voltage charging in the bit line is the resultant of the current supplied by the precharge circuit minus the draining current of the cell. The draining conduction current of each cell is dependent on the data programmed therein. Thus, a more conducting cell will result in less net current for voltage charging and slower charged up for the bit line, and vice versa.

As for charging the cross-coupling capacitance, the displacement current will depend on the voltage difference between the bit line being sensed and its neighbors. The voltage difference may come from the different rates of charging between the bit line and its neighbors. As described earlier, the bit line coupled to a more conducting cell will have less net current for voltage charging and will therefore charge up slower compared to a neighbor with a less conducting cell. Thus, when the bit line and its neighbors have similar memory states and therefore similar conducting currents opposing the precharging current, they will all charge up at similar rates and have similar voltages at any given time. In this case, the voltage difference across the cross-coupling capacitance will be relative small and likewise will the associated displacement current be.

Essentially, the bit line voltages of the plurality of bit line coupled to the plurality of memory cells are controlled such that the voltage difference between each adjacent pair of lines is substantially independent of time while their conduction currents are being sensed. When this condition is imposed, all the currents due to the various bit line capacitance drop out since they all depend on a time varying voltage difference. Thus, from the equation above, since $[i_{BLC00} + i_{BLC01} + i_{BLC02}] = 0$, the current sensed from the bit line is identical to the cell's current, e.g., $i_{BL0} = i_{CELL}$.

The largest displacement current will occur when the cells associated with the bit line being sensed and its neighbors have diametric memory states. For example, the bit line being sense is coupled to a non-conducting memory cell when its neighbors are coupled to cells that are highly conducting. In general, there will be a distribution in the range of displacement currents and its decaying life times. This means that the precharge operation must take place over a predetermined period beyond the worse case displacement current has decayed to a predetermined level before the bit line will be considered stable for accurate sensing.

Figure 13:
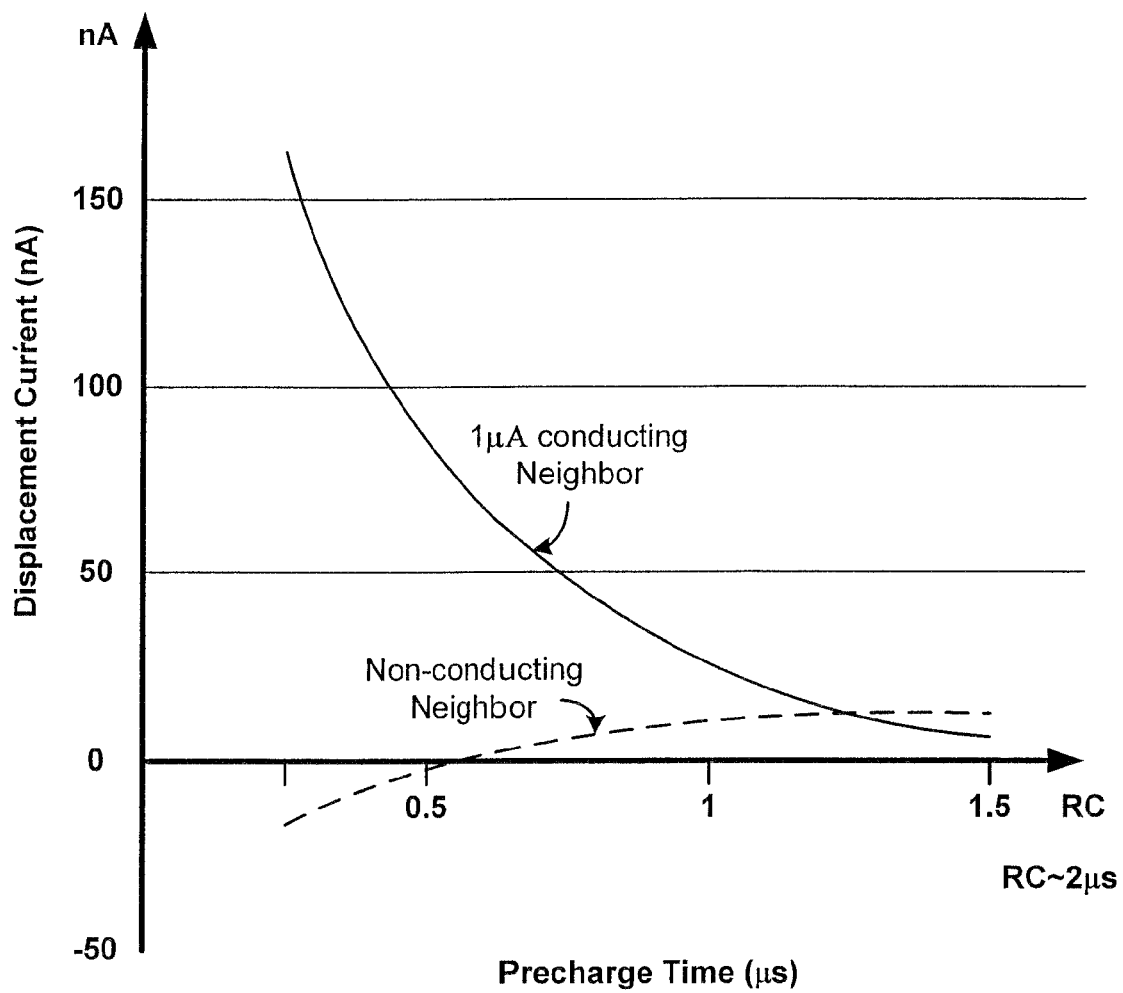
FIG. 13 illustrates a simulation of the worse-case displacement current during a precharge operation.

FIG. 13 illustrates a simulation of the worse-case displacement current during a precharge operation. To get the stabilizing bit lines, all bit lines will be charged to certain bit line level such as 0.5V. The precharge is normally with NAND chain on to reach the final bit line stability. The bit lines with conducting cells will be conducting as high as 1.5 uA. The SA will provide the current to charge up the bit line capacitance as well as fighting with the NAND chain current. This will cause high Icc current. In the simulation, a memory cell with a current of 1000 nA is regarded as "conducting" and a cell with a current of less than 5 nA is regarded as "non-conducting". The bit line being sensed has a cell current of 100 nA. The worse-case, cross coupled displacement current will be if the bit line being sensed is surrounded by neighbors having highly conductive cells. During precharge, these neighboring bit lines will have relatively less charging current, resulting in slower voltage rise relative to the bit line being sensed. This will create a substantial voltage difference across the cross-couple capacitance. The solid curve represents the worse-case displacement current as a function of normalized time. The normalized time is in units of the effective RC time constant of the cross-coupled circuits. The broken curve represents the case of the much smaller displacement current, produced when the neighbors have non-conducting states.

As shown in FIG. 13, the displacement current is high with short precharge time. The displacement current will decrease as the precharge time increase. Eventually, the displacement current will be minimal after about 1 RC when allowing for the worst case (solid curve).

Power Optimization by Reducing the Memory Cell's Turned-on Period During a Sensing Cycle

According to one aspect of the invention, the precharge operation on a bit line initially commences without turning on the associated cell. In this way, power is saved in not having to work against the draining effect of a turned-on cell. Also, by eliminating the state-dependent draining currents, all bit line will charge at similar rates resulting in charging to similar voltages. This will minimize the displacement currents due to bit-line to bit-line coupling. After the bit lines have been charged to a predetermined degree, the precharge continues with the cell turned on to allow a draining current to flow in order to reach a steady condition with a turned-on cell coupled to the precharging bit line. Thus, in a final phase of the precharge operation, the bit line is allowed to precharge under the normal conditions for sensing, which is with the cell turned on. Thereafter, as soon as the bit lines have attained a predetermined stability condition, sensing can begin. In this way, the power draining effect of the conducting cell is kept to a minimum for two reasons. One, unlike prior art cases, it is not turned on throughout the precharge operation since it is off in the initial phase of a precharge operation. The other reason is that the final phase of the precharge with the draining cell currents is also shortened. This is the phase when the bit lines are coupled to the cells with the conduction currents flowing. Since the initial phase results in the bit lines being charged to similar voltages, the reduced displacement currents allow the bit lines to stabilize more quickly.

Figure 14:
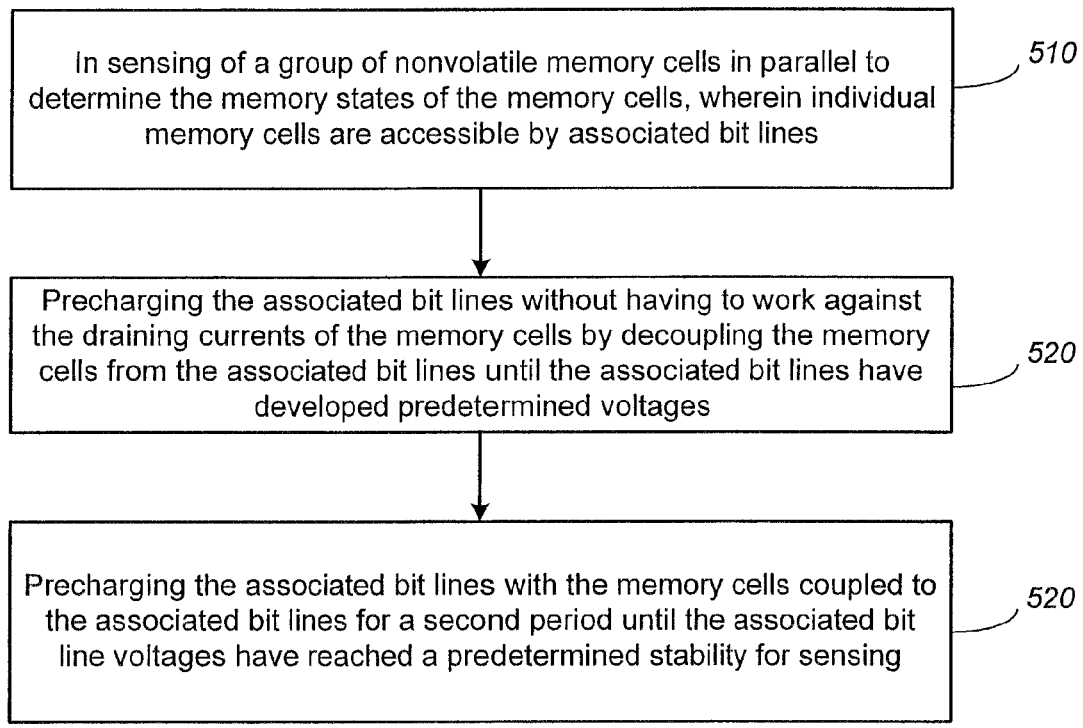
FIG. 14 is a flowchart for a power-saving sensing operation with reduced draining of memory cells, according to the invention.

FIG. 14 is a flowchart for a power-saving sensing operation with reduced draining of memory cells, according to the invention.

STEP 510: In sensing of a group of nonvolatile memory cells in parallel to determine the memory states of the memory cells, wherein individual memory cells are accessible by associated bit lines.

STEP 520: Precharging the associated bit lines without having to work against the draining currents of the memory cells by decoupling the memory cells from the associated bit lines until the associated bit lines have developed predetermined voltages.

STEP 530: Precharging the associated bit lines with the memory cells coupled to the associated bit lines for a second period until the associated bit line voltages have reached a predetermined stability for sensing.

Figure 15:
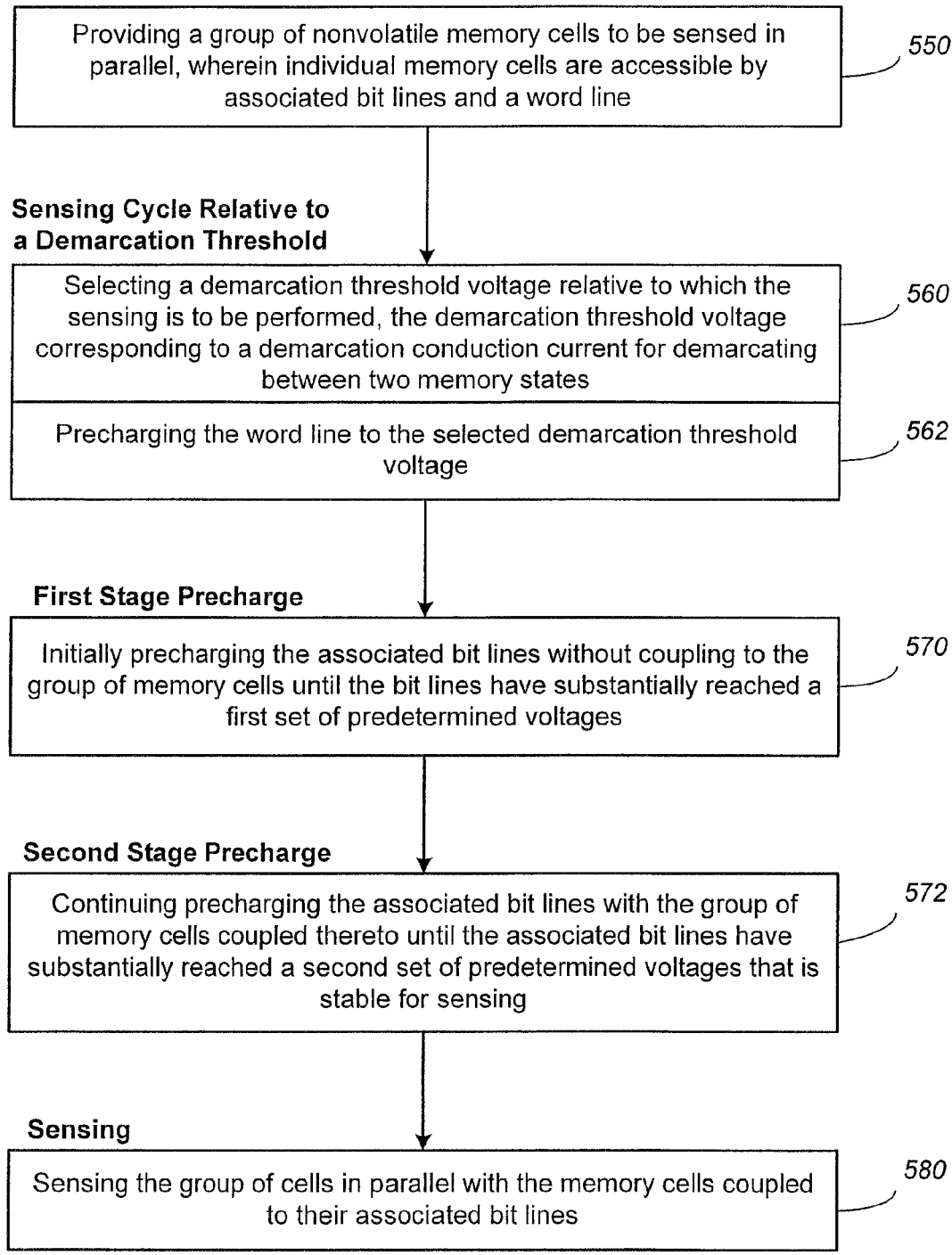
FIG. 15 is a flowchart for a power-saving sensing operation with reduced draining of memory cells, according to a preferred embodiment of the invention.

FIG. 15 is a flowchart for a power-saving sensing operation with reduced draining of memory cells, according to a preferred embodiment of the invention.

STEP 550: Providing a group of nonvolatile memory cells to be sensed in parallel, wherein individual memory cells are accessible by associated bit lines and a word line.

STEP 560: Selecting a demarcation threshold voltage relative to which the sensing is to be performed, the demarcation threshold voltage corresponding to a demarcation conduction current for demarcating between two memory states.

STEP 562: Precharging the word line to the selected demarcation threshold voltage.

STEP 570: Initially precharging the associated bit lines without coupling to the group of memory cells until the bit lines have substantially reached a first set of predetermined voltages.

STEP 572: Continuing precharging the associated bit lines with the group of memory cells coupled thereto until the associated bit lines have substantially reached a second set of predetermined voltages that is stable for sensing.

STEP 580: Sensing the group of cells in parallel with the memory cells coupled to their associated bit lines.

FIGS. 16(A)-16(I) are timing diagrams for signals that control the operation of the sense module 480 shown in FIG. 10. The overall scheme is to sense the page of memory cells in parallel relative to a given reference threshold level or reference conduction current. In other words, the sensing is to differentiate those cells with conduction current lower than the reference conduction current. In order to reduce source bias error, it is preferably to perform 2-pass sensing where the first pass is to identify those cells with conduction currents substantially high than the reference current. After these cells are identified and turned off, sensing relative to the reference current is performed in a second pass without the interference of the high current cells.

Each sensing relative to a reference threshold voltage therefore includes at least two sub-cycles, respectively shown as Phases (1)-(4) and Phases (5)-(9), with each sub-cycle being a pass at sensing the page of memory cells in parallel. Each sensing sub-cycle requires a setup to have the word lines and bit lines set to appropriate voltages before sensing can take place. This accomplished by a precharge operation. The selected word line gets to be precharged first (not shown), followed by the precharging of the bit lines (FIGS. 16(G)-16(I)).

The precharge operation for the first sub-cycle is between Phase (1)-(2) and that for the second sub-cycle is between Phase (6)-(7). Previously, the bit lines are pulled up by the precharge circuit while coupled to the memory cells. The bit lines are therefore precharged by the net effect of the pull up by the precharge circuit minus the pull down of the draining currents of the memory cells. Precharging with the memory cells coupled to the bit lines were adopted because in the next step of sensing the currents of the memory cells are sensed through the bit lines.

Figure 16:
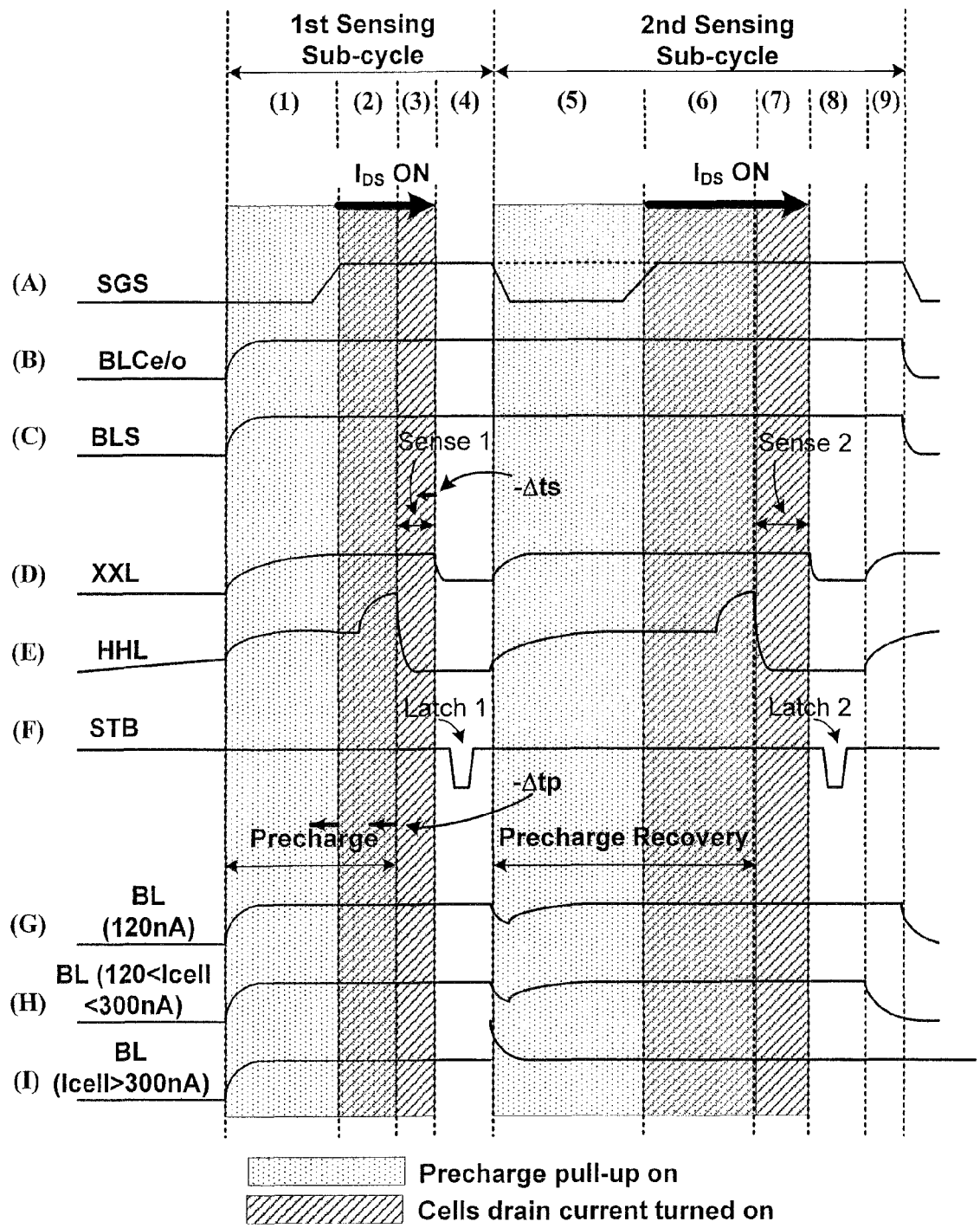
FIGS. 16(A)-16(I) are timing diagrams for signals that control the operation of the sense module 480 shown in FIG. 10.

The present invention prescribes decoupling the memory cells from the bit lines while the bit lines are being precharged initially. This is illustrated in FIG. 16(A) where the SGS signal is turned off in Phase (1) for the first sub-cycle and in Phase (5) for the second sub-cycle. This has the effect of cutting off the NAND chain at the source (see FIG. 10). After the bit lines have been precharged substantially to their target voltages, the memory cells are then coupled to them as shown in Phase (2) or Phase (7). This will allow the voltages on the bit lines to stabilize in the ultimate configuration before the page of memory cells is sensed.

Thus, power is saved in a sensing operation, especially during the precharge operation by reducing the period when the opposing drain currents are turned on.

Power Optimization by Reducing the Memory Cell's Turned-on Period by Prematurely Cutting Short the Bit Line Stabilizing Time

Another way of shortening the stabilizing phase of the precharge operation described above is to start the sensing even before the bit line has stabilized sufficiently for accurate sensing relative to a predetermined level for demarcating between memory states of the memory cell.

According to another aspect of the invention, in a sensing cycle to determine the programmed thresholds of a page of memory cells relative to a given demarcation threshold, wherein the sensing cycle take more than one sub-cycle of sensing to resolve all cells of the page, the precharge operation for at least an initial sub-cycle is prematurely shortened before the bit line is stable for accurate sensing in order to minimize power consumption. The shortened precharge period may led to inaccurate results applies to those precharge operations for sensing using multiple sub-cycles, where it takes more than one sub-cycle of sensing to resolve a given demarcation level.

In each sub-cycle, before sensing the conduction states of a page of memory cells, appropriate voltages must be set up via the bit lines and word lines.

Figure 17:
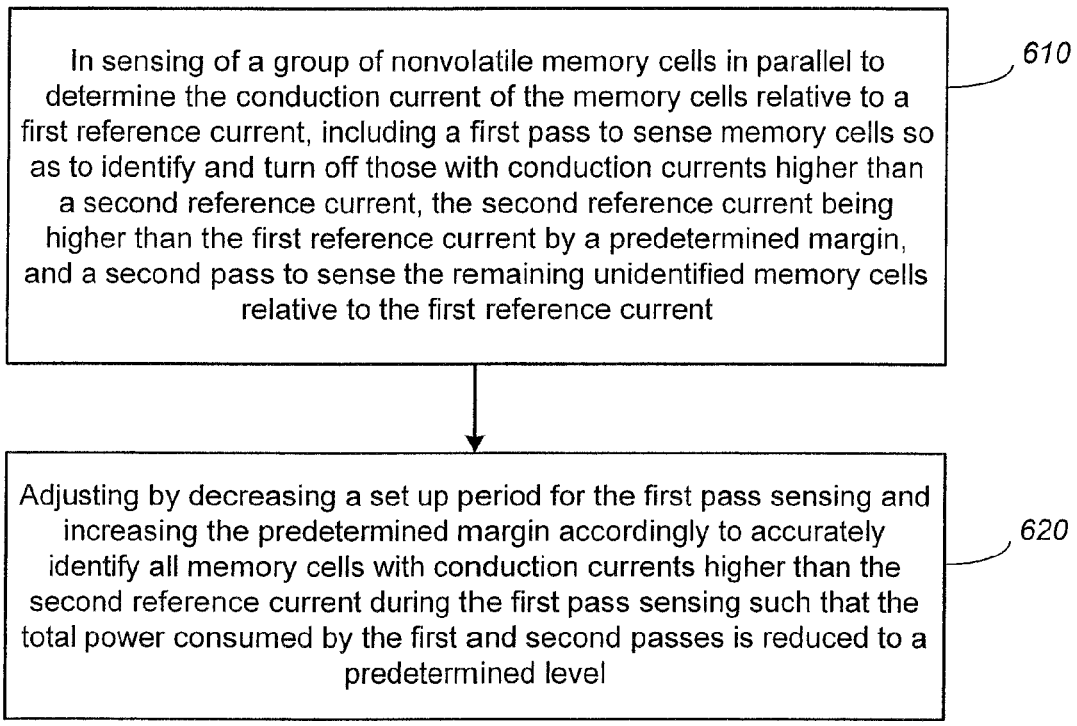
FIG. 17 is a flowchart for a power-saving sensing operation with reduced setup period, according to the present invention.

FIG. 17 is a flowchart for a power-saving sensing operation with reduced setup period, according to a general scheme of the present invention.

STEP 610: In sensing of a group of nonvolatile memory cells in parallel to determine the conduction current of the memory cells relative to a first reference current, including a first pass to sense memory cells so as to identify and turn off those with conduction currents higher than a second reference current, the second reference current being higher than the first reference current by a predetermined margin, and a second pass to sense the remaining unidentified memory cells relative to the first reference current;

STEP 620: Adjusting by decreasing a set up period for the first pass sensing and increasing the predetermined margin accordingly to accurately identify all memory cells with conduction currents higher than the second reference current during the first pass sensing such that the total power consumed by the first and second passes is reduced to a predetermined level.

Figure 18:
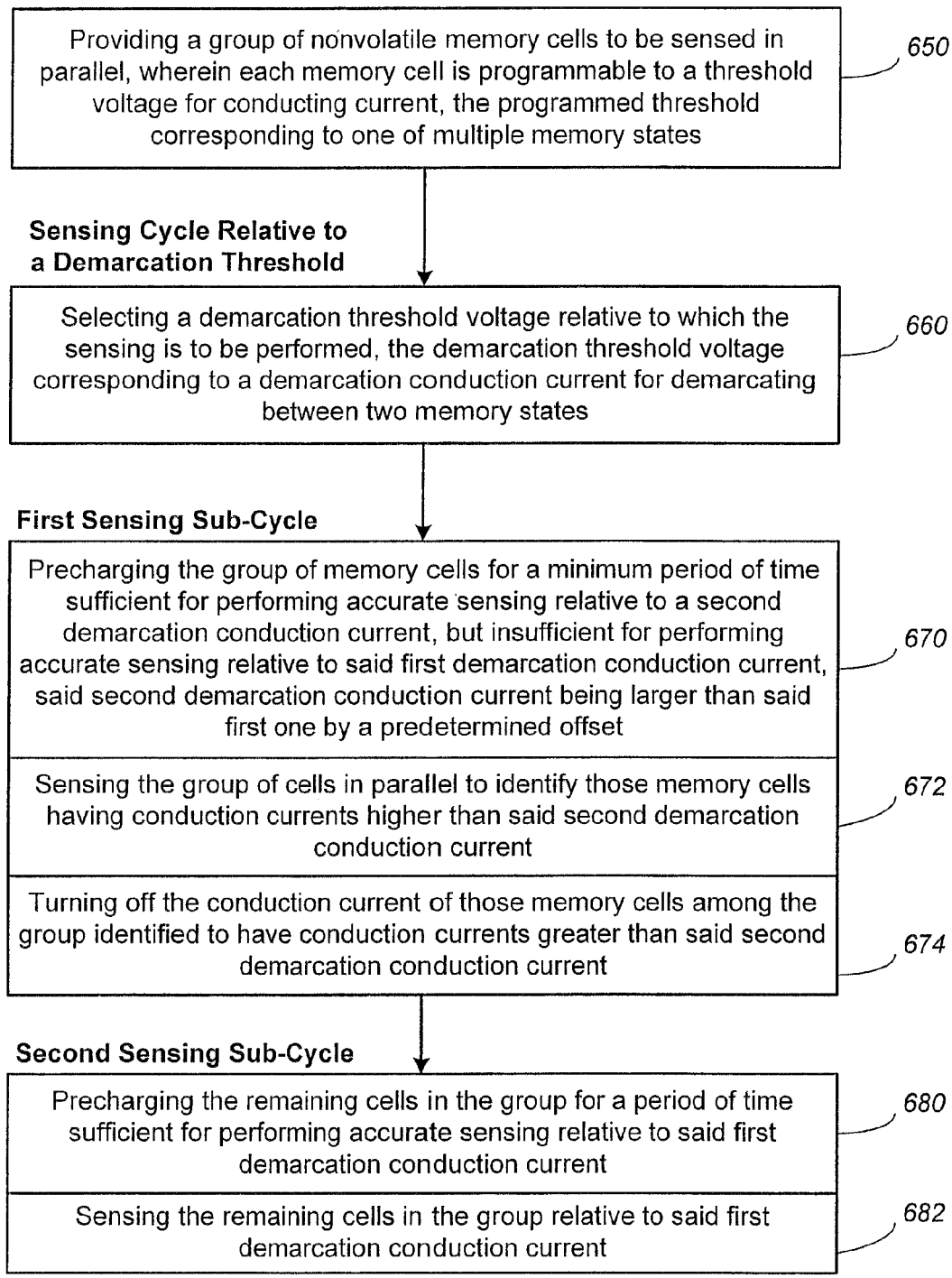
FIG. 18 is a flowchart for a power-saving sensing operation with reduced setup period, according to a preferred embodiment of the invention.

FIG. 18 is a flowchart for a power-saving sensing operation with reduced setup period, according to a preferred embodiment of the invention.

STEP 650: Providing a group of nonvolatile memory cells to be sensed in parallel, wherein each memory cell is programmable to a threshold voltage for conducting current, the programmed threshold corresponding to one of multiple memory states;

STEP 660: Selecting a demarcation threshold voltage relative to which the sensing is to be performed, the demarcation threshold voltage corresponding to a demarcation conduction current for demarcating between two memory states;

STEP 670: Precharging the group of memory cells for a minimum period of time sufficient for performing accurate sensing relative to a second demarcation conduction current, but insufficient for performing accurate sensing relative to said first demarcation conduction current, said second demarcation conduction current being larger than said first one by a predetermined offset;

STEP 672: Sensing the group of cells in parallel to identify those memory cells having conduction currents higher than said second demarcation conduction current;

STEP 674: Turning off the conduction current of those memory cells among the group identified to have conduction currents greater than said second demarcation conduction current;

STEP 680: Precharging the remaining cells in the group for a period of time sufficient for performing accurate sensing relative to said first demarcation conduction current;

STEP 682: Sensing the remaining cells in the group relative to said first demarcation conduction current.

The operations of illustrated in FIGS. 17 and 18 are further illustrated in the timing diagrams of FIGS. 16(A)-16(I). It has been described that each sensing relative to a reference threshold voltage includes at least two sub-cycles, each sub-cycle being a pass at sensing the page of memory cells in parallel. Each sensing sub-cycle requires a setup to have the word lines and bit line set to appropriate voltages before sensing can take place. The selected word line starts to precharge towards the threshold voltage at the beginning of the sub-cycle (not shown).

The first pass sub-cycle is between Phases (1)-(4). Precharge of the bit lines takes place between Phase (1) and Phase (2). The precharge of the bit lines can take place with or without the memory cells coupled to the bit lines. As described earlier, in the preferred embodiment, the cells are initially decoupled from the bit lines so that their draining currents do not work against the pull up of the bit lines. This is accomplished by cutting off the NAND chain to the source with SGS LOW (FIG. 16(A)). The precharge/clamp circuit 640 (see FIG. 10) is turned on by the signal HHL going HIGH (FIG. 16(E)) and the bit lines start to get pulled up (e.g., FIGS. 16(G), 16(H) and 16(I)). When the bit lines have been charged up close to their targeted value, Phase (2) of the precharge will commence. In Phase (2), the precharge continues, but with the cells coupled to the bit lines in order to allow the bit lines voltage stabilized under the condition for sensing.

The precharge in Phases (1) and (2) is the most power consuming portion of the overall sensing since all the high current cells of the page have yet to be eliminated and the precharge is working against the draining cell currents. The invention prescribes reducing this high power-consuming period (e.g., by $\Delta tp$), even at the expense of increased noise in the bit lines to be sensed (due to the persistence of some residual displacement currents (see FIG. 13)). Another effect of the reduction in the first precharge period is the time saving for all bit line sensing.

Sensing takes place in Phase (3). As described earlier, in the first sensing sub-cycle, the high current cells are identified. Thus, the sensing is relative to a reference threshold which is at a margin from that to be used in the next sensing sub-cycle. In other words, the first sub-cycle will use a demarcation current at a margin above that of next sub-cycle. However, the residual noise in the bit lines due to the shortened precharge in Phases (1) and (2) could lead to even cells with currents lower than the demarcation current being erroneously identified as high current cells. To compensate for the possible inaccuracies due to the effect of the shortened precharge, the margin is increased even further. In the preferred embodiment, this is accomplished by shortening the discharge time of the capacitor 652 in the cell current discriminator 650 (see FIG. 11B) of the sense module 480 (see FIG. 10). The signal HHL controls the transistor 632 (see FIG. 10) that couples or decouples the precharge circuit to the SEN node and therefore the cell current discriminator 650. On the other hand, the signal XXL controls the transistor 630 that couples or decouples the bit line from the SEN node. In this way, the current flowing in the bit line after XXL goes LOW will not affect the sensing results. In other words, XXL going LOW is the point where sensing stops. This will make the sampling time, STB strobe time, not as critical. At the beginning of Phase (3), the signal XXL is HIGH (FIG. 16D), coupling the sense amplifier to the bit line, whereas the signal HHL becomes LOW (FIG. 16(E)), thereby terminating the precharge. Thus, the cell current in the bit line will start to discharge the capacitor 652. At the end of Phase (3), the signal XXL goes LOW, thereby decoupling the bit line from the SEN node.

In Phase (4), the voltage of the discharged capacitor is then compared relative to the threshold voltage of the p-transistor 656 (see FIG. 11B) and the result is latched by the strobe signal STB. The increase margin described above is then accomplished by shortening the sensing period in Phase (3). In this way, only the highest currents will have been able to discharge the capacitor in the shortened period to trip the p-transistor 656.

After the first sub-cycle has identified the high current cells, they are then latched and turned off before the next sensing. In the next sensing sub-cycle as represented by Phases (5)-(9), the process is similar to the first sub-cycle except the precharge period in Phases (5)-(6) is not prematurely shortened. The sensing in Phase (7) take place after the voltages in the bit lines have stabilized with the displacement currents decayed to some insignificant value.

The scheme of shortening the precharge period of the first pass of a multi-pass sensing is particularly effective since the initial precharge is the most power consuming portion of the sensing. While the scheme, due to increased inaccuracies because of noise, does enable less number of high current cells to be identified in the first pass, and defer the missed ones to the next pass, there is overall saving in power consumption. The amount of shortening in the first-pass precharge will have to be balanced with the missed high current cells that the second-pass has to reckon with. The period in the first-pass precharge should be adjusted so that the total power consumed in the first and second pass is reduced.

While the description so far has been with respect to sensing relative to a given reference threshold, it will be clear from the examples given in FIGS. 7A-7E, 8A-8E, 9A-9E that for a multi-level memory, each of the reference thresholds would require a sensing cycle each with more than one sub-cycle.

Although the various aspects of the present invention have been described with respect to certain embodiments, it is understood that the invention is entitled to protection within the full scope of the appended claims.

What is claimed is:

1. A nonvolatile memory, comprising:
   a group of memory cells accessible by associated bit lines;
   a group of sensing circuits for sensing the group of memory cells in parallel to determine the conduction currents of the memory cells relative to a first reference current;
   a controller for controlling operations of the memory;
   said controller controlling the sensing circuits in first and second pass sensing;
   wherein:
   the group of memory cells are set up and sensed in a first pass to identify those memory cells with conduction currents higher than a second reference current that is higher than the first reference current by a predetermined margin;
   the identified higher current memory cells are turned off;
   the remaining unidentified memory cells are set up and sensed in a second pass relative to the first reference current; and
   the first pass further includes:
   a period of setup being reduced by a first predetermined amount;
   the predetermined margin by being increased by a second predetermined amount sufficient to accurately identify all memory cells with conduction currents higher than the second reference current; and
   the first predetermined amount is such that the total power consumed by the first and second passes is reduced to a predetermined level.

2. The nonvolatile memory as in claim 1, wherein said setting up is to set up the memory cell with voltages appropriate for sensing.

3. The nonvolatile memory as in claim 1, wherein said controller controlling set up of the memory cells up includes controlling precharging of the associated bit lines.

4. The nonvolatile memory as in claim 1, wherein a memory cell of the group is turned off by grounding its associated bit line.

5. The nonvolatile memory as in claim 1, wherein said group of sensing circuits operates in a read operation to read the memory states programmed into said group of memory cells.

6. The nonvolatile memory as in claim 1, wherein said group of sensing circuits operates in a program operation to verify if any of the memory cells has been programmed relative to the selected demarcation threshold voltage.

7. The nonvolatile memory as in claim 1, wherein the group of nonvolatile memory cells is a part of a flash EEPROM.

8. The nonvolatile memory as in any one of claims 1-7, wherein the nonvolatile memory cell of the group stores one bit of data.

9. The nonvolatile memory as in any one of claims 1-7, wherein the nonvolatile memory cell of the group stores more than one bit of data.

* * * * *